United States Patent
Cox et al.

(10) Patent No.: US 6,836,501 B2
(45) Date of Patent: Dec. 28, 2004

(54) RESONANT REFLECTOR FOR INCREASED WAVELENGTH AND POLARIZATION CONTROL

(75) Inventors: James A. Cox, New Brighton, MN (US); Robert A. Morgan, Plymouth, MN (US)

(73) Assignee: Finisar Corporation, Sunnyvale, CA (US)

( * ) Notice: Subject to any disclaimer, the term of this patent is extended or adjusted under 35 U.S.C. 154(b) by 380 days.

(21) Appl. No.: 10/121,490

(22) Filed: Apr. 12, 2002

(65) Prior Publication Data

US 2002/0106160 A1 Aug. 8, 2002

Related U.S. Application Data

(63) Continuation-in-part of application No. 09/751,422, filed on Dec. 29, 2000.

(51) Int. Cl.[7] .............................. H01S 3/08; H01S 5/00
(52) U.S. Cl. ......................................... 372/108; 372/50
(58) Field of Search .............................. 372/23, 50, 96, 372/108

(56) References Cited

U.S. PATENT DOCUMENTS

| 4,317,085 A | 2/1982 | Burnham et al. ............. 372/50 |
| 4,466,694 A | 8/1984 | MacDonald ................. 385/37 |
| 4,660,207 A | 4/1987 | Svilans ........................ 372/45 |

(List continued on next page.)

FOREIGN PATENT DOCUMENTS

| DE | 4 240 706 A | 6/1994 |
| EP | 0 288 184 A | 10/1988 |
| EP | 0 776 076 A | 5/1997 |
| JP | 60-123084 A | 7/1985 |
| JP | 02-054981 A | 2/1990 |
| JP | 05-299779 | 11/1993 |

OTHER PUBLICATIONS

Morgan et al., "Producible GaAs–based MOVPE–Grown Vertical–Cavity Top–Surface Emitting Lasers with Record Performance", *Elec. Lett.*, vol. 31, No. 6, pp. 462–464, Mar. 16, 1995.

Morgan et al., "Spatial–Filtered Vertical–Cavity Top Surface–Emitting Lasers", CLEO, 1993, pp. 138–139, no month.

Morgan et al., Vertical Cavity Surface Emitting Laser Arrays: Come of Age, Invited paper, *SPIE*, vol. 2683, 0-8194-2057-3/96, pp. 18–29, no date.

S.S. Wang and R. Magnusson, "Multilayer Waveguide–Grating Filters", *Appl. Opt.*, vol. 34, No. 14, pp. 2414–2420, 1995, May 1995.

S.S. Wang and R. Magnusson, "Theory and Applications of Guided–Mode Resonance Filters", *Appl. Opt.*, vol. 32, No. 14, pp. 2606–2613, 1993, no month.

(List continued on next page.)

*Primary Examiner*—Quyen Leung
(74) *Attorney, Agent, or Firm*—Workman Nydegger

(57) ABSTRACT

An optical system that includes at least two optical emitters and/or optical receivers that have a corresponding guided-mode grating resonant reflector filter (GMGRF). Each GMGRF is preferably tuned to a unique wavelength and/or polarization by adjusting selected GMGRF parameters, such as the grating period and/or the thickness of the grating or other layers. One advantage of this construction is that the various optical emitters and/or optical receivers may be finely tuned, often lithographically, to provide fine wavelength resolution and/or polarization control. For WDM and WDD applications, this may allow closely-spaced optical transmission channels, and may simplify the wavelength-selective WDM and WDD operations required for simultaneous transmission of the channels.

24 Claims, 20 Drawing Sheets

U.S. PATENT DOCUMENTS

| | | | |
|---|---|---|---|
| 4,784,722 A | 11/1988 | Liau et al. | 438/34 |
| 4,885,592 A | 12/1989 | Kofol et al. | 343/754 |
| 4,901,327 A | 2/1990 | Bradley | 372/45 |
| 4,943,970 A | 7/1990 | Bradley | 372/45 |
| 4,956,844 A | 9/1990 | Goodhue et al. | 372/44 |
| 5,031,187 A | 7/1991 | Orenstein et al. | 372/50 |
| 5,052,016 A | 9/1991 | Mahbobzadeh et al. | 372/96 |
| 5,056,098 A | 10/1991 | Anthony et al. | 372/45 |
| 5,062,115 A | 10/1991 | Thornton | 372/50 |
| 5,068,869 A | 11/1991 | Wang et al. | 372/45 |
| 5,079,774 A | 1/1992 | Mendez et al. | 372/27 |
| 5,115,442 A | 5/1992 | Lee et al. | 372/45 |
| 5,117,469 A | 5/1992 | Cheung et al. | 388/11 |
| 5,140,605 A | 8/1992 | Paoli et al. | 372/50 |
| 5,157,537 A | 10/1992 | Rosenblatt et al. | 359/245 |
| 5,158,908 A | 10/1992 | Blonder et al. | 438/32 |
| 5,216,263 A | 6/1993 | Paoli | 257/88 |
| 5,216,680 A | 6/1993 | Magnusson et al. | 372/20 |
| 5,237,581 A | 8/1993 | Asada et al. | 372/45 |
| 5,245,622 A | 9/1993 | Jewell et al. | 372/45 |
| 5,258,990 A | 11/1993 | Olbright et al. | 372/46 |
| 5,285,466 A | 2/1994 | Tabatabaie | 372/50 |
| 5,293,392 A | 3/1994 | Shieh et al. | 372/45 |
| 5,317,170 A | 5/1994 | Paoli | 257/88 |
| 5,317,587 A | 5/1994 | Ackley et al. | 372/45 |
| 5,325,386 A | 6/1994 | Jewell et al. | 372/50 |
| 5,331,654 A | 7/1994 | Jewell et al. | 372/45 |
| 5,337,074 A | 8/1994 | Thornton | 347/237 |
| 5,337,183 A | 8/1994 | Rosenblatt | 359/248 |
| 5,349,599 A | 9/1994 | Larkins | 372/50 |
| 5,351,256 A | 9/1994 | Schneider et al. | 372/45 |
| 5,359,447 A | 10/1994 | Hahn et al. | 398/201 |
| 5,359,618 A | 10/1994 | Lebby et al. | 372/45 |
| 5,363,397 A | 11/1994 | Collins et al. | 372/92 |
| 5,373,520 A | 12/1994 | Shoji et al. | 372/45 |
| 5,384,797 A * | 1/1995 | Welch et al. | 372/23 |
| 5,386,426 A | 1/1995 | Stephens | 372/20 |
| 5,390,209 A | 2/1995 | Vakhshoori | 372/45 |
| 5,396,508 A | 3/1995 | Bour et al. | 372/27 |
| 5,404,373 A | 4/1995 | Cheng | 372/50 |
| 5,412,678 A | 5/1995 | Treat et al. | 372/45 |
| 5,412,680 A | 5/1995 | Swirhun et al. | 372/45 |
| 5,416,044 A | 5/1995 | Chino et al. | 438/39 |
| 5,428,634 A | 6/1995 | Bryan et al. | 372/45 |
| 5,438,584 A | 8/1995 | Paoli et al. | 372/45 |
| 5,446,754 A | 8/1995 | Jewell et al. | 372/45 |
| 5,465,263 A | 11/1995 | Bour et al. | 372/23 |
| 5,475,701 A | 12/1995 | Hibbs-Brenner | 372/50 |
| 5,497,390 A | 3/1996 | Tanaka et al. | 372/50 |
| 5,513,202 A | 4/1996 | Kobayashi et al. | 372/96 |
| 5,530,715 A | 6/1996 | Shieh et al. | 372/96 |
| 5,555,255 A | 9/1996 | Kock et al. | 372/96 |
| 5,557,626 A | 9/1996 | Grodzinski et al. | 372/45 |
| 5,561,683 A | 10/1996 | Kwon | 372/96 |
| 5,568,499 A | 10/1996 | Lear | 372/45 |
| 5,586,131 A | 12/1996 | Ono et al. | 372/19 |
| 5,590,145 A | 12/1996 | Nitta | 372/50 |
| 5,598,300 A | 1/1997 | Magnusson et al. | 372/566 |
| 5,606,572 A | 2/1997 | Swirhun et al. | 372/96 |
| 5,625,729 A | 4/1997 | Brown | 385/31 |
| 5,642,376 A | 6/1997 | Olbright et al. | 372/99 |
| 5,645,462 A | 7/1997 | Banno et al. | 445/51 |
| 5,646,978 A | 7/1997 | Klem et al. | 455/436 |
| 5,648,978 A | 7/1997 | Sakata | 372/50 |
| 5,673,284 A * | 9/1997 | Congdon et al. | 372/50 |
| 5,699,373 A | 12/1997 | Uchida et al. | 372/27 |
| 5,712,188 A | 1/1998 | Chu et al. | 438/40 |
| 5,726,805 A | 3/1998 | Kaushik et al. | 359/589 |
| 5,727,013 A | 3/1998 | Botez et al. | 372/96 |
| 5,727,014 A | 3/1998 | Wang et al. | 372/96 |
| 5,774,487 A | 6/1998 | Morgan | 372/45 |
| 5,778,018 A * | 7/1998 | Yoshikawa et al. | 372/45 |
| 5,784,399 A | 7/1998 | Sun | 372/50 |
| 5,818,066 A | 10/1998 | Duboz | 257/21 |
| 5,828,684 A | 10/1998 | Van de Walle | 372/45 |
| 5,901,166 A | 5/1999 | Nitta et al. | 372/50 |
| 5,903,590 A | 5/1999 | Hadley et al. | 372/96 |
| 5,940,422 A | 8/1999 | Johnson | 372/45 |
| 5,953,362 A | 9/1999 | Pamulapati et al. | 372/96 |
| 5,978,401 A | 11/1999 | Morgan | 372/45 |
| 5,995,531 A | 11/1999 | Gaw et al. | 372/96 |
| 6,002,705 A | 12/1999 | Thornton | 372/96 |
| 6,008,675 A | 12/1999 | Handa | 372/96 |
| 6,043,104 A | 3/2000 | Uchida et al. | 438/32 |
| 6,055,262 A | 4/2000 | Cox et al. | 372/96 |
| 6,064,783 A * | 5/2000 | Congdon et al. | 385/15 |
| 6,154,480 A | 11/2000 | Magnusson et al. | 372/96 |
| 6,191,890 B1 | 2/2001 | Baets et al. | 359/572 |
| 6,212,312 B1 | 4/2001 | Grann et al. | 385/24 |

OTHER PUBLICATIONS

Schubert, "Resonant Cavity Light–Emitting Diode", *Appl. Phys. Lett.*, vol. 60, No. 8, pp. 921–923, Feb. 24, 1992.

Y. M. Yang et al., "Ultralow Threshold Current Vertical Cavity Surface Emitting Lasers Obtained with Selective Oxidation", *Elect. Lett.*, vol. 31, No. 11, pp. 886–888, May 25, 1995.

Yablonovitch et al., "Photonic Bandgap Structures", *J. Opt. Soc. Am. B.*, vol. 10, No. 2, pp. 283–295, Feb. 1993.

Young et al., "Enhanced Performance of Offset–Gain High Barrier Vertical–Cavity Surface–Emitting Lasers", *IEEE J. Quantum Electron.*, vol. 29, No. 6, pp. 2013–2022, Jun. 1993.

Smith, R.E. et al., Polarization–Sensitive Subwavelength Antireflection Surfaces on a Semiconductor for 975 NM, *Optics Letters*, vol. 21, No. 15, Aug. 1, 1996, pp. 1201–1203.

Suning Tang et al., "Design Limitations of Highly Parallel Free–Space Optical Interconnects Based on Arrays of Vertical Cavity Surface–Emitting Laser Diodes, Microlenses, and Photodetectors", Journal of Lightwave Technology, vol. 12, No. 11, Nov. 1, 1994, pp. 1971–1975.

Cox, J. A., et al., "Guided Mode Grating Resonant Filters for VCSEL Applications", *Proceedings of the SPIE*, The International Society for Optical Engineering, Diffractive and Holographic Device Technologies and Applications V, San Jose, California, Jan. 28–29, 1998, vol. 3291, pp. 70–71.

Martinsson et al., "Transverse Mode Selection in Large–Area Oxide–Confined Vertical–Cavity Surface–Emitting Lasers Using a Shallow Surface Relief", *IEEE Photon. Technol. Lett.*, vol.11 No. 12, pp. 1536–1538, Dec. 1999.

Choquette et al., "Lithographically–Defined Gain Apertures Within Selectively Oxidized VCSELs", paper CtuL6, Conference on Lasers and Electro–Optics, San Francisco, California (2000).

Oh, T. H. et al., "Single–Mode Operation in Antiguided Vertical–Cavity Surface–Emitting Laser Using a Low–Temperature Grown AlGaAs Dielectric Aperture", *IEEE Photon. Technol. Lett*, 10(8), 1064–1066 (1998), no month.

Min Soo Park and Byung Tae Ahn, "Polarization control of vertical–cavity surface–emitting lasers by electro–optic birefringence," Applied Physics Letter, vol. 76, No. 7, pp. 813–815, Feb. 14, 2000.

J.A. Cox, et al., "Guided–mode granting resonant filters for VCSEL applications," SPIE vol. 3291, 0277–786X/98, pp. 70–76, no month.

Tshikazu Mukaihara, et al., "A Novel Birefringent Distributed Bragg Reflector Using a Metal/Dielectric Polarizer for Polarization Control of Surface–Emitting Lasers," Japan J. Appl. Phys. vol. 33 (1994) pp. L227–L229, Part 2, No. 2B, Feb. 15, 1994.

Hideaki Saito, et al., "Controlling polarization of quantum–dot surface–emitting lasers by using structurally anisotropic self–assembled quantum dots," American Institute of Physics, Appl, Phys. Lett. 71 (5), pp. 590–592, Aug. 4, 1997.

T. Mukaihara, "Polarization Control of Vertical–cavity Surface–Emitting Lasers by a Birefringent Metal/Semiconductor Polarizer Terminating a Distributed Bragg Reflector," Tokyo Institute of Technology, Precision and Intelligence Laboratory, pp. 183–184, no date available.

Guenter et al., "Reliability of Proton–Implanted VCSELs for Data Communications", Invited paper, *SPIE*, vol. 2683, OE LASE 96; Photonics West: Fabrication, Testing and Reliability of Semiconductor Lasers, (SPIE, Bellingham, WA 1996), no month.

Hibbs–Brenner et al., "Performance, Uniformity and Yield of 850 nm VCSELs Deposited by MOVPE", *IEEE Phot. Tech. Lett.*, vol. 8, No. 1, pp. 7–9, Jan. 1996.

Hornak et al., "Low–Termperature (10K–300K) Characterization of MOVPE–Grown Vertical–Cavity Surface–Emitting Lasers", *Photon. Tech. Lett.*, vol. 7, No. 10, pp. 1110–1112, Oct. 1995.

Huffaker et al., "Lasing Characteristics of Low Threshold Microcavity Layers Using Half–Wave Spacer Layers and Lateral Index Confinement", *Appl. Phys. Lett.*, vol. 66, No. 14, pp. 1723–1725, Apr. 3, 1995.

K.L. Lear et al., "Selectively Oxidized Vertical Cavity Surface–Emitting Lasers with 50% Power Conversion Efficiency", *Elec. Lett.*, vol. 31, No. 3 pp. 208–209, Feb. 2, 1995.

Lehman et al., "High Frequency Modulation Characteristics of Hybrid Dielectric/AlGaAs Mirror Singlemode VCSELs", *Electronic Letters*, vol. 31, No. 15, Jul. 20, 1995, pp. 1251–1252.

Magnusson, "Integration of Guided–Mode Resonance Filters and VCSELs", Electo–Optics Research Center, Department of Electrical Engineering, University of Texas at Arlington, May 6, 1997.

Morgan et al., "One Watt Vertical Cavity Surface Emitting Laser", *Electron. Lett.*, vol. 29, No. 2, pp. 206–207, Jan. 21, 1993.

Jewell et al., "Surface–Emitting Microlasers for Photonic Switching and Interchip Connections", *Optical Engineering*, vol. 29, No. 3, pp. 210–214, Mar. 1990.

G. Shtengel et al., "High–Speed Vertical–Cavity Surface–Emitting Lasers", *Photon. Tech. Lett.*, vol. 5, No. 12, pp. 1359–1361 (Dec. 1993).

U.S. Appl. No. 09/751,423, filed Dec. 29, 2000, entitled "Spatially Modulated Reflector for an Optoelectronic Device".

Banwell et al., "VCSE Laser Transmitters for Parallel Data Links", *IEEE Journal of Quantum Electronics*, vol. 29, No. 2, Feb. 1993, pp. 635–644.

Catchmark et al., "High Temperature CW Operation of Vertical Cavity Top Surface–Emitting Lasers", CLEO 1993, p. 138, no month.

Chemla et al., "Nonlinear Optical Properties of Semiconductor Quantum Wells", *Optical Nonlinearities and Instabilities in Semiconductors*, Academic Press, Inc., Copyright 1988, pp. 83–120, no month.

Choa et al., "High–Speed Modulation of Vertical–Cavity Surface–Emitting Lasers", *IEEE Photonics Technology Letter*, vol. 3, No. 8, Aug. 1991, pp. 697–699.

G. G. Ortiz, et al., "Monolithic Integration of In0.2 GA0.8As Vertical Cavity Surface–Emitting Lasers with Resonance–Enhanced Quantum Well Photodetectors", *Electronics Letters*, vol. 32, No. 13, Jun. 20, 1996, pp. 1205–1207.

Graf, Rudolph, *Modern Dictionary of Electronics*, $6^{th}$ ed., Indiana: Howard W. Sams & Company, 1984, p. 694, no month.

Jewell et al., "Surface Emitting Microlasers for Photonic Switching & Intership Connections", *Optical Engineering*, vol. 29, No. 3, pp. 210–214, Mar. 1990.

Jewell et al., "Surface–Emitting Microlasers for Photonic Switching and Interchip Connections", *Optical Engineering*, vol. 29, No. 3, Mar. 1990, pp. 210–214.

Kishino et al., "Resonant Cavity–Enhanced (RCE) Photodetectors", *IEEE Journal of Quantum Electronics*, vol. 27, No. 8, pp. 2025–2034, no date.

Kuchibhotla et al., "Low–Voltage High Gain Resonant_Cavity Avalanche Photodiode", *IEEE Phototonics Technology Letters*, vol. 3, No. 4, pp. 354–356, no date.

Lai et al., "Design of a Tunable GaAs/AlGaAs Multiple–Quantum–Well Resonant Cavity Photodetector", *IEEE Journal of Quantum Electronics*, vol. 30, No. 1, pp. 108–114, no date.

Lee et al., "Top–Surface Emitting GaAs Four–Quantum–Well Lasers Emitting at 0–85 um", *Electronics Letters*, vol. 24, No. 11, May 24, 1990, pp. 710–711.

Miller et al., "Optical Bistability Due to Increasing Absorption", *Optics Letters*, vol. 9, No. 5, May 1984, pp. 162–164.

Morgan et al., "200 C, 96–nm Wavelength Range, Continuous–Wave Lasing from Unbonded GaAs MOVPE–Grown Vertical Cavity Surface–Emitting Lasers", *IEEE Photonics Technology Letters*, vol. 7, No. 5, May 1995, pp. 441–443.

Jiang et al., "High–Frequency Polarization Self–Modulation in Vertical–Cavity Surface–Emitting Lasers", *Appl. Phys. Letters*, vol. 63, No. 26, Dec. 27, 1993, pp. 2545–2547.

Morgan et al., "High–Power Coherently Coupled 8×8 Vertical Cavity Surface Emitting Laser Array", *Appl. Phys Letters*, vol. 61, No. 10, Sep. 7, 1992, pp. 1160–1162.

Morgan et al., "Hybrid Dielectric/AlGaAs Mirror Spatially Filtered Vertical Cavity Top–Surface Emitting Laser", *Appl. Phys. Letters*, vol. 66, No. 10, Mar. 6, 1995, pp. 1157–1159.

Morgan et al., "Novel Hibrid–DBR Single–Mode Controlled GaAs Top–Emitting VCSEL with Record Low Voltage", 2 pages, dated prior to Dec. 29, 2000.

Morgan et al., "Progress and Properties of High–Power Coherent Vertical Cavity Surface Emitting Laser Arrays", *SPIE*, Vo. 1850, Jan. 1993, pp. 100–108.

Morgan et al., "Progress in Planarized Vertical Cavity Surface Emitting Laser Devices and Arrays", *SPIE*, vol. 1562, Jul. 1991, pp. 149–159.

Morgan et al., "Submilliamp, Low–Resistance, Continuous–Wave, Single–Mode GaAs Planar Vertical–Cavity Surface Emitting Lasers", Honeywell Technology Center, Jun. 6, 1995.

Morgan et al., "Transverse Mode Control of Vertical–Cavity Top–Surface Emitting Lasers", *IEEE Photonics Technology Letters*, vol. 4, No. 4, Apr. 1993, pp. 374–377.

Morgan et al., "Vertical–Cavity Surface–Emitting Laser Arrays" *SPIE*, vol. 2398, Feb. 1995, pp. 65–93.

Morgan, "High–Performance, Producible Vertical Cavity Lasers for Optical Interconnects", *High Speed Electronics and Systems*, vol. 5, No. 4, Dec. 1994, pp. 65–95.

Morgan, "Transverse Mode Control of Vertical–Cavity Top–Surface–Emitting Lasers", *IEEE Phot. Tech. Lett.*, vol. 4, No. 4., p. 374, Apr. 1993.

Nugent et al., "Self–Pulsations in Vertical–Cavity Surface–Emitting Lasers", *Electronic Letters*, vol. 31, No. 1, Jan. 5, 1995, pp. 43–44.

U.S. Appl. No. 09/751,422, filed Dec. 29, 2000, entitled "Resonant Reflector for Use with Optoelectronic Devices".

International Search Report, dated Sep. 17, 2003, relative to PCT application No. PCT/US 03/11093, the foreign equivalent to the instant U.S. application 10/121,490.

Cox, J.A. et al. "Guided–mode grating resonant filters for VCSEL applications" Jan. 28, 1998, Proceedings of the Spie, Spie, Bellingham, VA, US, vol. 3291, pp. 70–76.

Wang, S. S. et al. "Multilayer waveguide–grating filters", May 10, 1995, Applied Optics, Optical Society of America, Washington, US, vol. 34, No. 14, pp. 2414–2420.

* cited by examiner

RESONANT REFLECTOR FOR INCREASED WAVELENGTH AND POLARIZATION CONTROL

This application is a continuation-in-part of co-pending U.S. patent application Ser. No. 09/751,422, filed Dec. 29, 2000, and entitled "Resonant Reflector For Use With Optoelectronic Devices".

BACKGROUND OF THE INVENTION

This invention relates to the field of optoelectronic devices, and more particularly to resonant reflectors for use with optoelectronic devices.

Various forms of optoelectronic devices have been developed and have found widespread use including, for example, semiconductor lasers, semiconductor photodiodes, semiconductor photo detectors, etc. For some of these applications, an optoelectronic emitter such as a semiconductor laser is coupled to an optoelectronic detector (e.g., photodiode or Resonant Cavity Photo Detector) through a fiber optic link or even free space. This configuration can provide a high-speed communication path, which, for many applications, can be extremely beneficial.

The increased use of all-optical fiber networks as backbones for global communication systems has been based in large part on the extremely wide optical transmission bandwidth provided by optical fiber. This has led to an increased demand for the practical utilization of the optical fiber bandwidth, which can provide, for example, increase communication system user capacity. In the prevailing manner for exploiting optical fiber bandwidth, wavelength-division multiplexing (WDM) and wavelength-division demultiplexing (WDD) techniques are used to enable the simultaneous transmission of multiple independent optical data streams, each at a distinct wavelength, on a single optical fiber, with wavelength-selective WDM and WDD control provided for coupling of the multiple data streams with the optical fiber on a wavelength-specific basis. With this capability, a single optical fiber can be configured to simultaneously transmit several optical data streams, e.g., ten optical data streams, that each might not exceed, say, 10 Gb/s, but that together represent an aggregate optical fiber transmission bandwidth of more than, say, 100 Gb/s.

In order to increase the aggregate transmission bandwidth of an optical fiber, it is generally preferred that the wavelength spacing of simultaneously transmitted optical data streams, or optical data "channels," be closely packed to accommodate a larger number of channels. In other words, the difference in wavelength between two adjacent channels is preferably minimized. The desire for closely-spaced optical transmission channels results in the need for fine wavelength resolution, which complicates the wavelength-selective WDM and WDD operations required for simultaneous transmission of the channels. Like WDM, Polarization Division Multiplexing (PDM) can also be used to extend the bandwidth of some optical data channels.

SUMMARY OF THE INVENTION

The present invention provides an optical system that includes at least two optical emitters and/or optical receivers that have a corresponding guided-mode grating resonant reflector filter (GMGRF). The optical emitters are preferably Vertical Cavity Surface Emitting Lasers (VCSELs), but other optical emitters may be used. Likewise, the optical receivers may be Resonant Cavity Photo Detectors (RCPDs), but other optical receivers may also be used. Each GMGRF is preferably tuned to a unique wavelength and/or polarization by adjusting selected GMGRF parameters, such as the grating period and/or the thickness of the grating or other layers. One advantage of this construction is that the various optical emitters and/or optical receivers may be finely tuned, preferably lithographically, to provide fine wavelength resolution and/or polarization control. For WDM and WDD applications, this may allow for closely spaced optical transmission channels, and may simplify the wavelength-selective WDM and WDD operations required for simultaneous transmission of data channels.

When two or more optical emitters with GMGRF filters are provided, the respective wavelength and/or polarization light outputs may be provided to a common optical element, such as a common optical fiber. Such an optical system may be useful in, for example, WDM, PDM and/or other applications, as desired. In some applications, the various wavelength and/or polarization light outputs may be provided from the optical fiber to the two or more optical receivers, which may then selectively detect a corresponding wavelength and/or polarization. In one embodiment, the optical receivers are Resonant Cavity Photo Detector (RCPD) with a GMGRF incorporated into or adjacent a top mirror thereof. The resonant wavelength of each RCPD is preferably tuned to receive a wavelength and/or polarization of one or more of the optical emitters. This may help simplify the wavelength-selective WDM and WDD operations required for simultaneous transmission of data channels. In another illustrative embodiment, select wavelengths are directed to a particular optical receiver by an optical filter, optical splitter, or the like. In this embodiment, the optical receiver may be a wide band optical receiver, as the wavelength selectivity is provided by the optical filter, optical splitter, or the like, rather than the optical receiver itself. A combination of these embodiments may also be used.

In some embodiments, the GMGRF includes a core layer positioned adjacent a grating layer. The grating layer may extend into the core layer, leaving a core depth between the grating elements and the opposite surface of the core layer. The core layer may have a core thickness, and the grating layer may have a grating period and a grating height. To tune the resonant reflector, and in one illustrative embodiment, the core thickness and grating height may remain substantially fixed, and the grating period may be adjusted or set to produce the desired wavelength. An advantage of this embodiment is that the desired wavelength can be tuned lithographically. In another illustrative embodiment, the ratio of the core depth to the grating height may be set to produce a desired wavelength. In either of these illustrative embodiments, the resonant wavelength of the GMGRF can be tuned to a desired wavelength.

It is also recognized that the wavelength selectivity capability of such GMGRF filters has applicability in display applications. As the grating itself may determine the wavelength of operation, and fabrication is done lithographically, laterally-displaced wavelength dependent emitters can be formed. Such a structure may also serve as a quasi-tunable laser source. Wavelength tunable VCSELs and detectors, as further described below, may also find use in spectroscopic and sensing applications.

The improved performance coupled with the capability to control polarization can also lend itself to applications in polarization-sensitive optical read/write applications. Included are various forms of CD, DVD, and holographic storage applications. Laser printing heads may also benefit. The performance advantage, and use of thinner top and/or bottom mirrors becomes even more paramount when extending VCSELs into the visible wavelengths, where typical all-epitaxial DBRs become prohibitively thick and may require twice as many layers.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
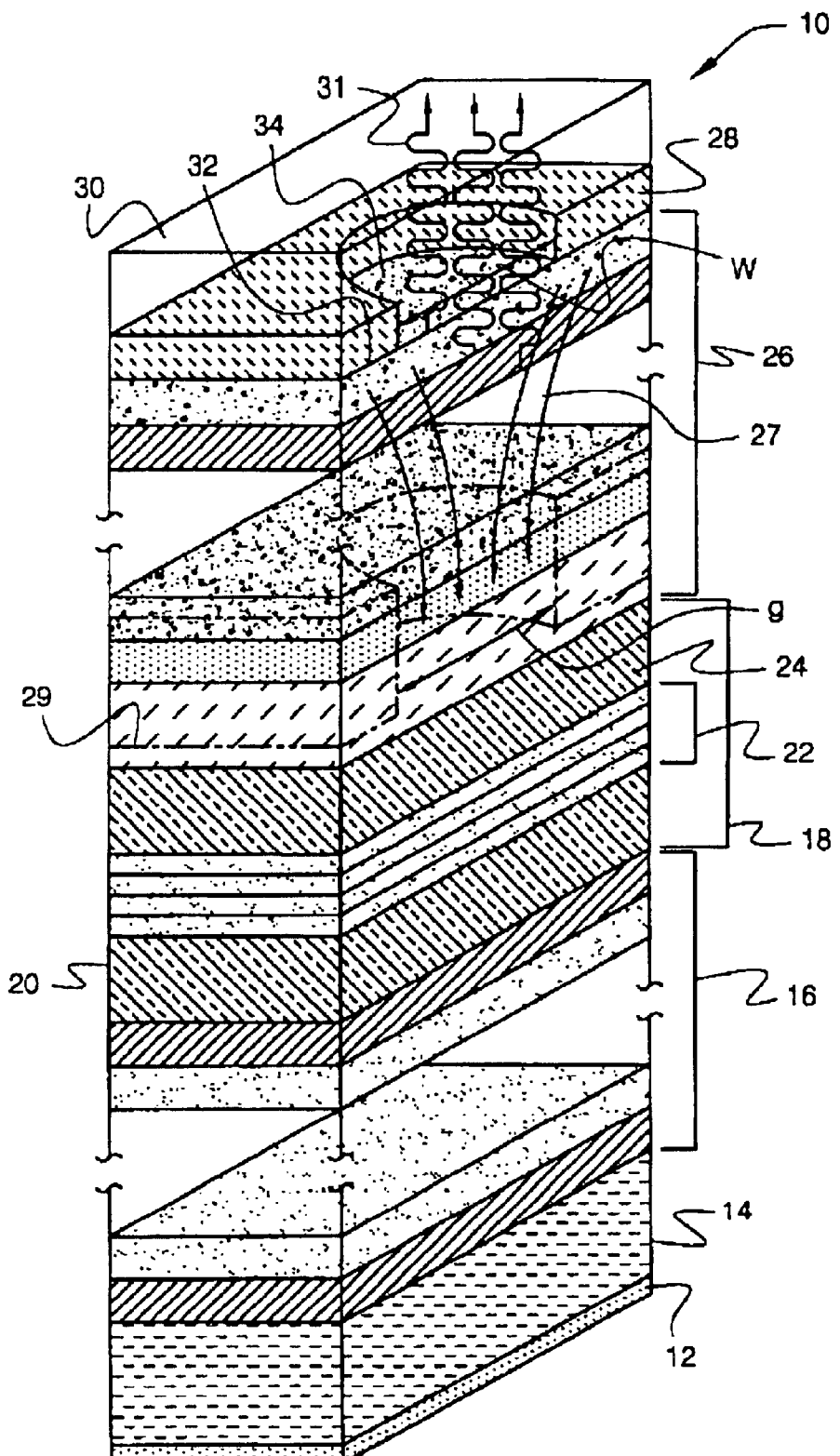
FIG. 1 is a schematic diagram of a planar, current-guided, GaAs/AlGaAs top surface emitting vertical cavity laser in accordance with the prior art.

FIG. 1 is a schematic illustration of a planar, current-guided, GaAs/AlGaAs top surface emitting vertical cavity laser 10 in accordance with the prior art. Formed on an n-doped gallium arsenide (GaAs) substrate 14 is a n-contact 12. Substrate 14 is doped with impurities of a first type (i.e., n type). An n-type mirror stack 16 is formed on substrate 14. Formed on stack 16 is a spacer 18. Spacer 18 has a bottom confinement layer 20 and a top confinement layer 24 surrounding active region 22. A p-type mirror stack 26 is formed on top confinement layer 24. A p-metal layer 28 is formed on stack 26. The emission region may have a passivation layer 30.

Isolation region 29 restricts the area of the current flow 27 through the active region. Region 29 may be formed by deep H+ ion implantation. While a deep H+ implant is provided as an illustration, it is contemplated that any type of current and field confinement may be used, including for example, gain-guided, oxide-confinement, or any othermeans. The diameter "g" maybe set to provide the desired active area, and thus the gain aperture of the VCSEL 10. Further, the diameter "g" may be set by the desired resistance of the p-type mirror stack 26, particularly through the non-conductive region 29. Thus, non-conductive region 29 performs the gain guiding function. The diameter "g" is typically limited by fabrication limitations, such as lateral straggle during the implantation step.

Spacer 18 may contain a bulk or quantum-well active region disposed between mirror stacks 16 and 26. Quantum-well active region 22 may have alternating layers of aluminum gallium arsenide (AlGaAs) barrier layers and GaAs quantum-well layers. InGaAs quantum wells may also be used in the active region, particularly where an emission wavelength (e.g., $\lambda$=980 nm) is desired where GaAs is transparent. Stacks 16 and 26 are distributed Bragg reflector (DBR) stacks, and may include periodic layers of doped AlGaAs and aluminum arsenide (AlAs). The AlGaAs of stack 16 is doped with the same type of impurity as substrate 14 (e.g., n type), and the AlGaAs of stack 26 is doped with the other kind of impurity (e.g., p type).

Metal contact layers 12 and 28 are ohmic contacts that allow appropriate electrical biasing of laser diode 10. When laser diode 10 is forward biased with a more positive voltage on contact 28 than on contact 12, active region 22 emits light 31 which passes through stack 26.

A typical near IR VCSEL requires high reflectivity (>99%). Thus, an all-semiconductor DBR typically requires 20–40 mirror periods with a thickness of 2–4 $\mu$m. As such, the epi-structure required for a complete VCSEL, including both top and bottom DBR mirrors surrounding an active spacer region typically includes over 200 layers having a thickness in excess of 7–8 $\mu$m.

Figure 2:
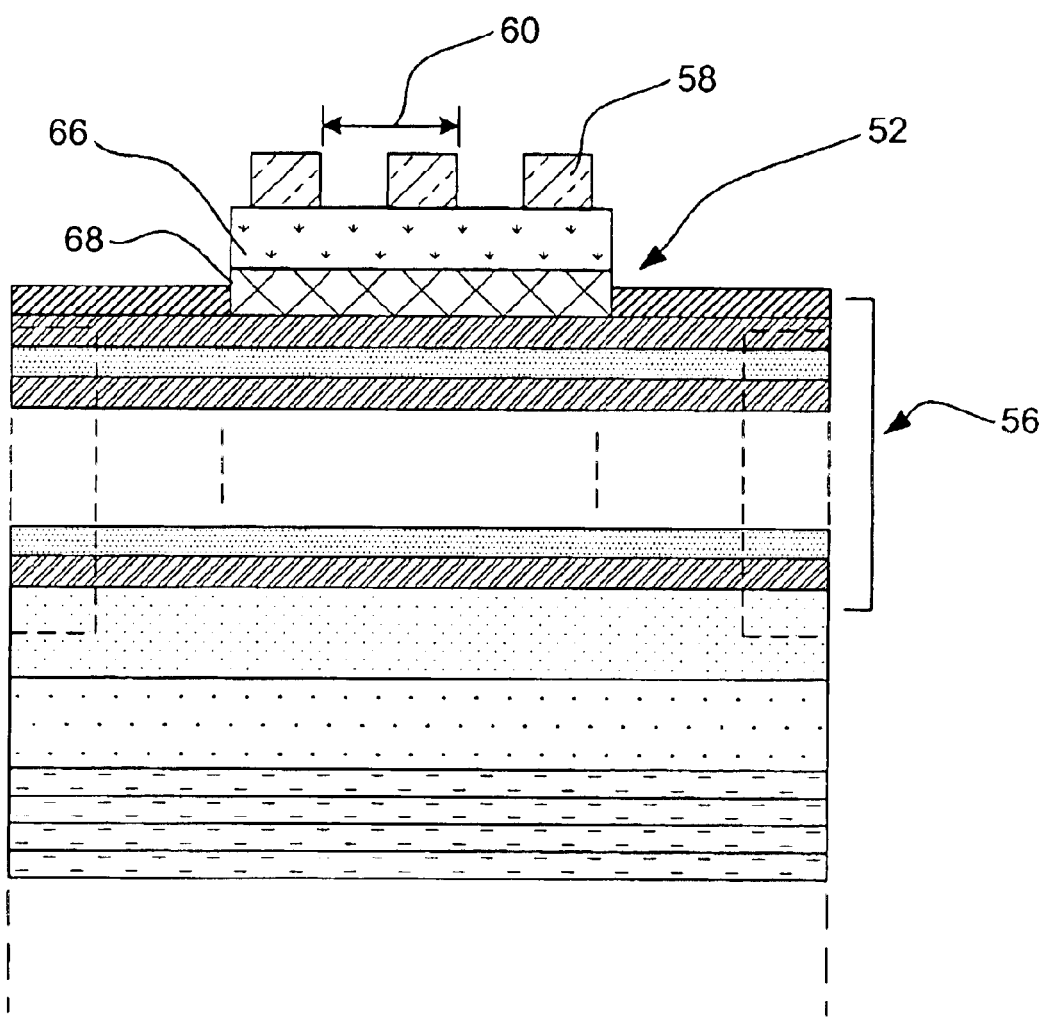
FIG. 2 is a schematic cross-sectional side view of a planar, current-guided, GaAs/AlGaAs top surface emitting vertical cavity laser with an illustrative resonant reflector.

As discussed in U.S. patent application Ser. No. 08/872,534, entitled "Resonant Reflector For Improved Optoelectronic Device Performance And Enhanced Applicability", a hybrid mirror structure may be used to reduce the overall mirror thickness. FIG. 2 is a schematic cross-sectional side view of a planar, current-guided, GaAs/AlGaAs top surface emitting vertical cavity laser with a hybrid top mirror including a resonant reflector 52 and a distributed Bragg reflector 56. This device combines the anomalous filtering properties of guided mode resonance in a dielectric waveguide grating with the reflective properties of a conventional DBR mirror.

The hybrid mirror structure includes, for example, a resonant reflector 52 and a DBR mirror 56. Although not explicitly shown, it is contemplated that the bottom mirror may also include a resonant reflector structure, if desired. It is known that a dielectric resonant reflector 52 is highly reflective on resonance, and may be more reflective than a corresponding DBR type mirror at the same wavelength. Thus, by using a hybrid approach, it is contemplated that the number of DBR mirror periods needed for a given reflectance may be reduced.

It is known that lateral straggle effects during ion implantation of the gain guiding region 62 through the DBR mirrors often limits the lateral dimension 64 of the active region to $\geq$10 $\mu$m. This directly impacts the minimum achievable threshold current, single mode operation, and indirectly impacts the speed of the VCSEL. By incorporating a resonant reflector into the top mirror, equivalent or superior reflectance properties in a structure five to ten times thinner may be achieved. This may translate into an ion implant that is more controllable, which may reduce the volume of the active region. A smaller active region may reduce the operating current and power of the device, improve planarity and thus the monolithic integrability of the VCSEL with electronics and smart pixels, and may provide a controllable single mode and single polarization emission with increased modal control.

It is recognized that the hybrid approach of FIG. 2 is compatible with alternate existing gain-guiding techniques including etched pillars (with or without planarization and/or regrowth), lateral oxidation, selective growth, etc. By decreasing the overall thickness of the VCSEL mirrors, the resonant reflector may improve the processibility and performance of the alternate current guiding approaches. While ion implantation is provided as an illustration, it is contemplated that any type of current and field confinement may be used, including for example, gain-guided, oxide-confinement, or any other means.

The resonant reflector 52 of FIG. 2 includes a three layer waveguide-grating structure suitable for use in a near IR VCSEL. The three-layer stack may be designed to function both as an anti-reflection (AR) coating near the emission wavelength for the VCSEL-structure substrate and independently as a guided-mode resonant reflector waveguide-grating (i.e. a guided-mode grating resonant reflector filter or GMGRF).

The three layers of resonant reflector 52 may form an anti-reflective region, which provides little reflectance for at least a predetermined range of wavelengths including a resonant wavelength. The grating multilayer waveguide structure shown at 52 causes the structure to become substantially more reflective, at least at the resonant wavelength.

Alternatively, the three-layer stack 52 may be designed to function both as a high-reflectivity coating for the VCSEL-structure substrate and independently as a guided-mode resonant reflector waveguide-grating. In this embodiment, the three-layer structure 52 forms a highly-reflective mirror region which provides reflectance for at least a predetermined range of wavelengths including a resonant wavelength (e.g., near 980 nm). The overall reflectance of the top mirror, including layers 66 and 68, may be less than that required for lasing. This may be accomplished by, for example, reducing the number of mirror periods in the top DBR mirror 56. Grating layer 58 causes the guided mode resonant reflector structure 52 to become substantially more reflective at least near the resonant wavelength. In either case, the number of DBR mirror layers beneath the resonant reflector 52 may be reduced relative to the conventional VCSEL construction shown in FIG. 1.

Resonance is achieved in the resonance reflector 52 by matching the first-diffraction order wave vector of the grating 58 to the propagating mode of the waveguide 66. Since the latter depends on polarization, the reflectance is inherently polarization-selective. The resonant wavelength is determined primarily by the grating period 60, and the bandwidth is determined primarily by the modulation of the refractive index and fill factor of the grating 58.

Figure 3:
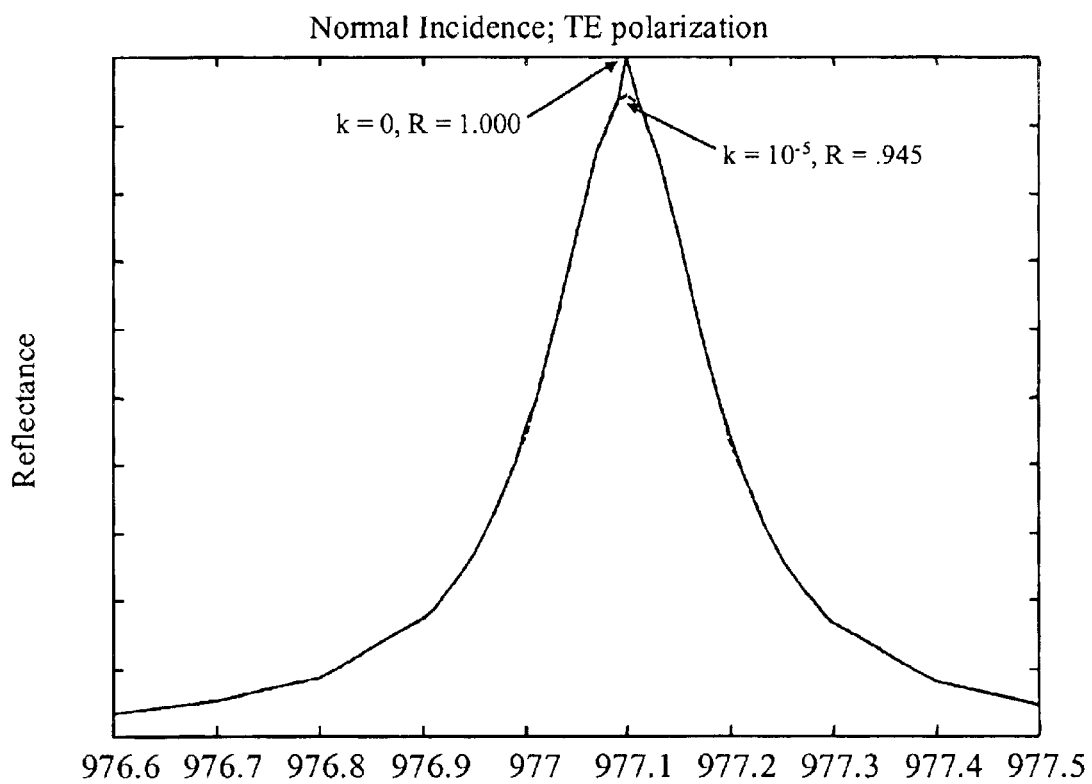
FIG. 3 is a graph showing the reflectivity versus wavelength of the resonant reflector of FIG. 2, both with a non-conductive (k=0) waveguide layer and a slightly conductive ($k=10^{-5}$) waveguide layer.

FIG. 3 is a graph showing reflectance curves for a resonant reflector assuming two values for the imaginary component of the refractive index (k=0 and $10^{-5}$) in any one layer of the waveguide-grating structure, and k=0 in the other two layers. In this example, the top layer, middle layer and bottom layer are formed from Indium Tin Oxide (ITO), GaAs, and AlGaAs, respectively. The refraction indices for the top, middle and bottom layers are 1.96, 3.5 and 3.24, respectively, and the thicknesses of the top, middle and bottom layers are preferably $\lambda/4$, $3\lambda/4$ and $\lambda/4$, respectively. For this measurement, the layers are placed on a substrate with an effective reflective index of 3.2. This structure is simulated to exhibit one transverse Electric (TE) mode resonance (with a polarization parallel to the grating), no perpendicular resonance and a low out of resonant reflectance near $10^{-6}$.

The imaginary component "k" of the refractive index is related to optical absorption and electrical conductivity of the resonant reflector. The case k=$10^{-5}$, which roughly corresponds to the minimum conductivity required to inject current through the resonant reflector, produces about 5 percent absorption. The same three layers, all with k=0, indicating a dielectric resonant reflector, produces theoretically 100 percent reflectance.

This graph illustrates the extreme sensitivity of the resonant reflector 52 to absorption, or more generally, to loss of any kind. Thus, to maximize the reflectance provided by the resonant reflector, the absorption (e.g. k=0) for each of the layers 58, 66 and 68 should be near zero. This means that the conductivity of the resonant reflector should also be zero (e.g., non-conductive).

Figure 4:
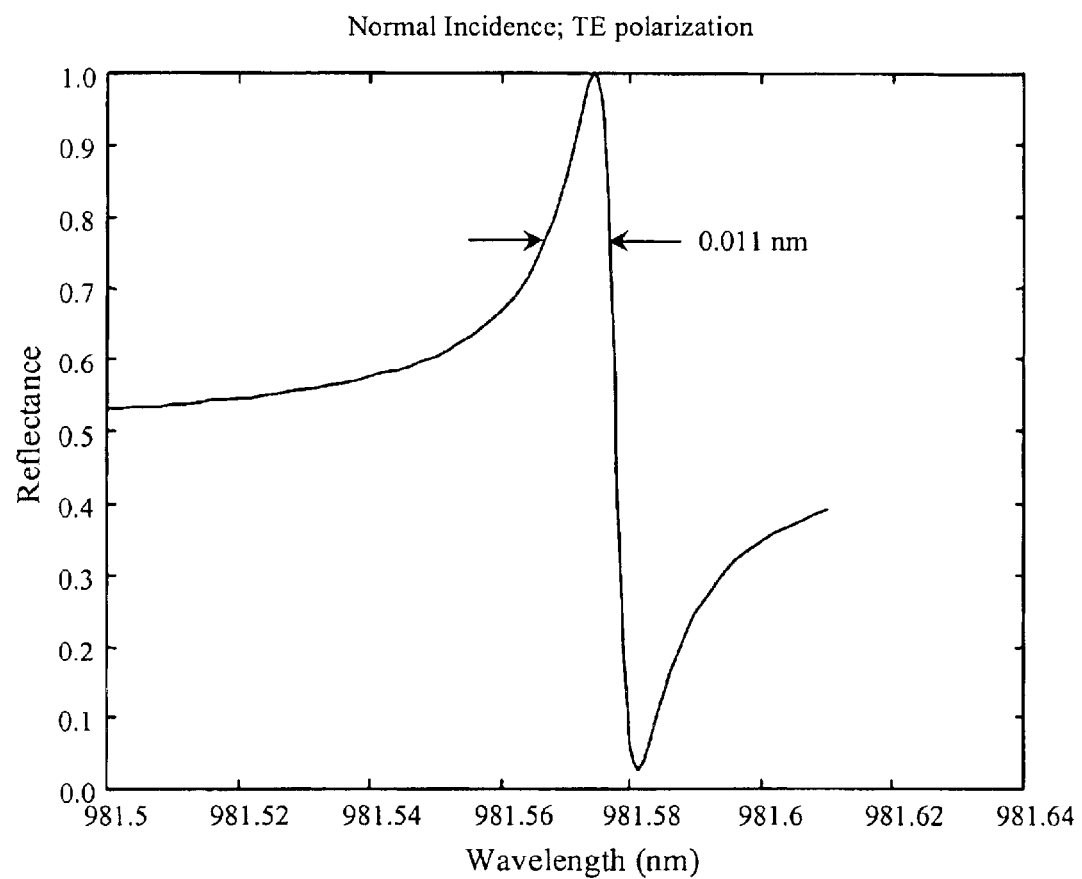
FIG. 4 is a graph showing the reflectance versus wavelength of an all non-conductive (k=0) resonant reflector placed adjacent a top mirror that is also non-conductive (k=0)
Figure 5:
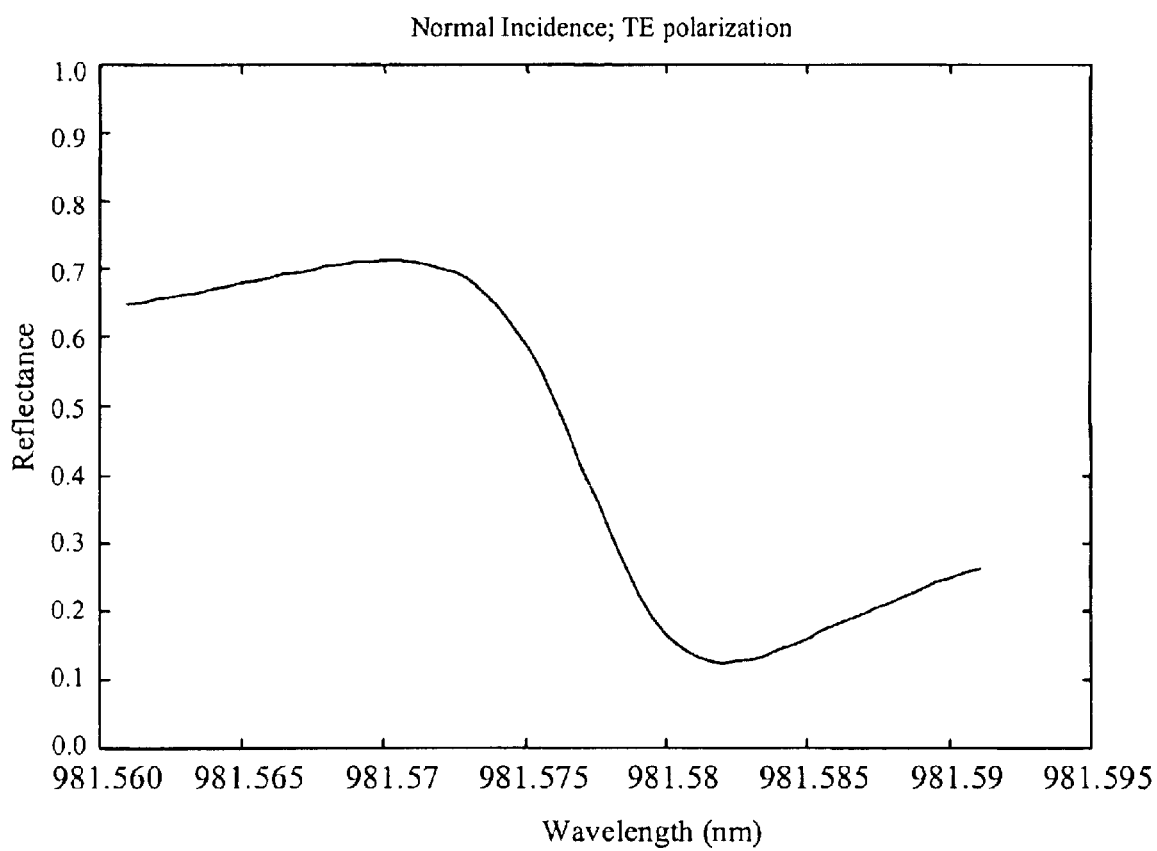
FIG. 5 shows the reflectance versus wavelength of an all non-conductive resonant reflector placed adjacent a top mirror that is slightly conductive ($k=10^{-5}$)

Despite the advantages of using a resonant reflector in conjunction with a DBR mirror stack, it has been found that the reflectivity of the resonant reflector can be limited if not properly isolated from the DBR mirror stack. FIG. 4 is a graph showing the reflectance versus wavelength of an all non-conductive (k=0) resonant reflector placed adjacent a top mirror that is also non-conductive (k=0). The reflectance curve has a narrow bandwidth, and reaches about 100% reflectivity at the resonant wavelength. In contrast, FIG. 5 shows the reflectance versus wavelength of an all non-conductive resonant reflector placed adjacent a top mirror that is slightly conductive (k=10$^{-5}$). As can be seen, having an adjacent top mirror that is slightly conductive significantly degrades the performance of the resonant reflector. Too much energy in the guided-mode in the waveguide overlaps into the lossy, conductive DBR films of the optoelectronic device.

To overcome this and other difficulties, the present invention contemplates isolating the resonant reflector from adjacent conducting layers. Isolation is preferably accomplished by providing a non-conductive (e.g. dielectric) buffer or cladding layer between the resonant reflector and the adjacent conducting layer of the optoelectronic device. The non-conductive cladding or buffer layer is preferably sufficiently thick, and/or has a sufficiently low refractive index relative to the refractive index of the waveguide of the resonant reflector, to substantially prevent energy in the evanescent tail of the guided mode in the waveguide from entering the adjacent conductive layer of the optoelectronic device. In a preferred embodiment, the waveguide is formed from a dielectric that has a higher refractive index than the refractive index of the buffer or cladding layer, and also higher than the average refractive index of the grating. The thickness of the waveguide preferably depends on the refractive index difference between the waveguide and the buffer or cladding layer.

Figure 6:
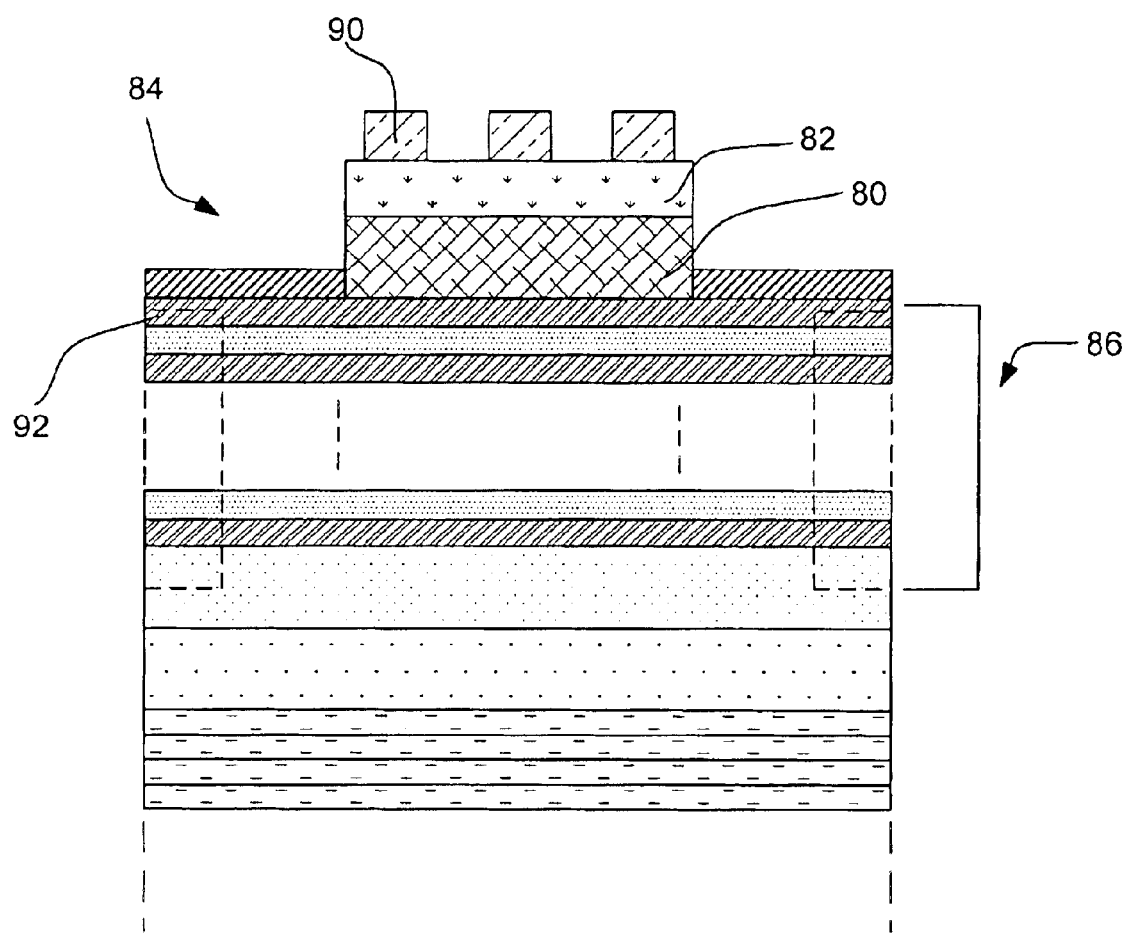
FIG. 6 is a schematic cross-sectional side view of a planar, current-guided, GaAs/AlGaAs top surface emitting vertical cavity laser with a cladding or buffer layer interposed between the waveguide layer of the resonant reflector and the top DBR mirror.

FIG. 6 is a schematic cross-sectional side view of a planar, current-guided, GaAs/AlGaAs top surface emitting vertical cavity laser with a cladding or buffer layer 80 interposed between the waveguide layer 82 of the resonant reflector 84 and the top DBR mirror 86. As indicated above, the cladding or buffer layer 80 is preferably sufficiently thick, and/or has a sufficiently low refractive index relative to the refractive index of the waveguide of the resonant reflector, to substantially prevent energy in the evanescent tail of the guided mode in the waveguide from entering an adjacent conductive layer of the optoelectronic device.

In the illustrative embodiment, the grating layer 90 is SiO$_2$ with an index of refraction of about 1.484 and a thickness of 0.340 μm. The waveguide layer 82 may be GaAs with an index of refraction of 3.523 and a thickness of 0.280 μm. Alternatively, the waveguide may be a ternary compound such as Al$_x$Ga$_{1-x}$As, with x close to one, or a high refractive index dielectric such as TiO2, ZrO2, HfO2, or Si3N4. The thickness of the waveguide preferably depends on the refractive index difference between the waveguide and the buffer or cladding layer. The cladding or buffer layer 80 in the illustrative embodiment is AlO, with an index of refraction of 1.6 and a thickness of 0.766 μm. Finally, the top DBR mirror layer 92 may be AlGaAs with an index of refraction of 3.418 and a thickness of 0.072 μm. In this embodiment, the cladding or buffer layer 80 has an increased thickness and a reduced index of refraction relative to the embodiment shown in FIG. 2, both of which help prevent energy in the evanescent tail of the guided mode in the waveguide layer 82 from entering the top DBR mirror layer 92. It is contemplated however, that similar results may be achieved by either increasing the thickness or reducing the index of refraction of the cladding or buffer layer 80, if desired.

As indicated above, the cladding or buffer layer 80 may be AlO, which has a relatively low refractive index. In one method, this can be accomplished by initially forming the cladding or buffer layer 80 with AlGaAs, with a relatively high concentration of aluminum (e.g. >95%). AlGaAs has a relatively high index of refraction. Then, the waveguide layer 82 and grating layer 90 are provided. The cladding or buffer layer 80, waveguide layer 82 and grating 90 may then be removed around the periphery of the desired optical cavity. Contacts 93 may then be deposited on the exposed top mirror 86 to provide electrical contact to the top mirror. Then, the device may be subject to an oxidizing environment, which oxidizes the AlGaAs material of the cladding or buffer layer 80, resulting in AlO which has a relatively low refractive index. The AlGaAs material is preferably oxidized laterally in from the exposed edges of the cladding or buffer layer 80.

Figure 7:
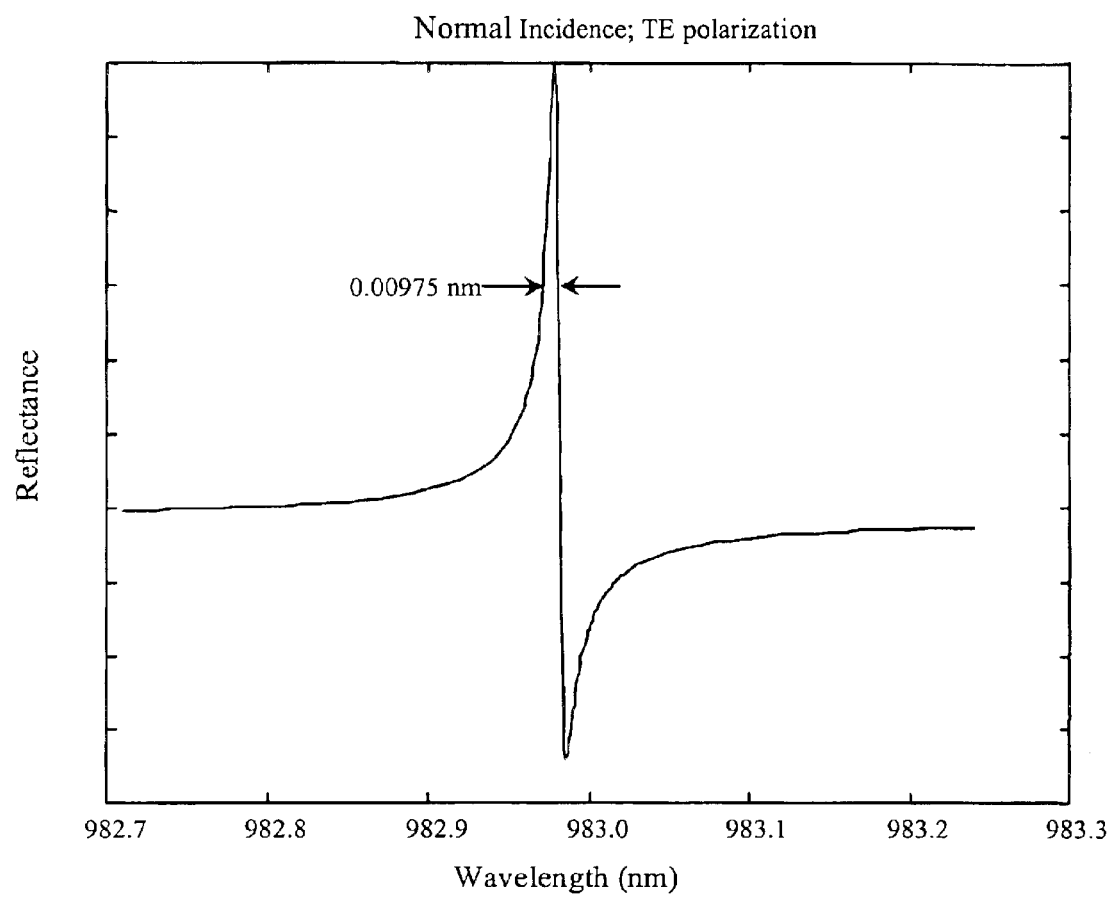
FIG. 7 is a graph showing the reflectance versus wavelength of the resonant reflector of FIG. 6 when the top layers of the top DBR mirror 86 are non-conductive (k=0)
Figure 8:
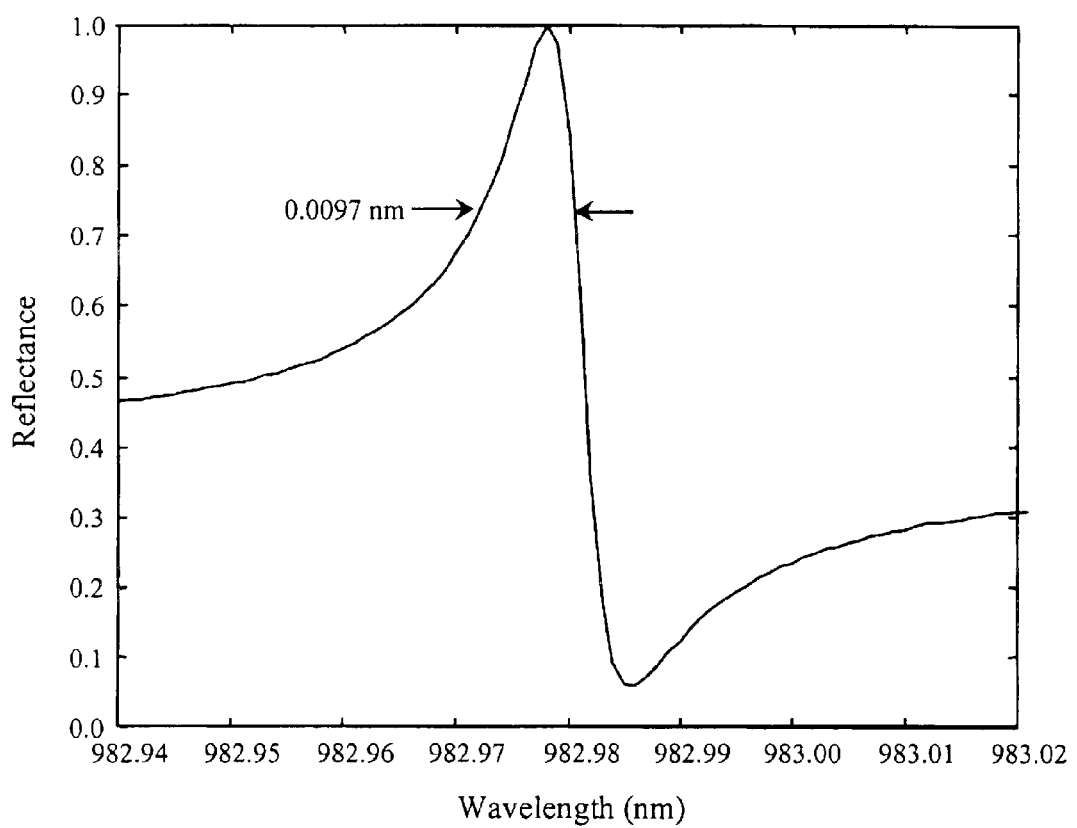
FIG. 8 is a graph showing the reflectance versus wavelength of the resonant reflector of FIG. 6 when the top layers of the top DBR mirror 86 are slightly conductive ($k=10^{-5}$)

FIG. 7 is a graph showing the reflectance versus wavelength of the resonant reflector of FIG. 6 when the top layers of the top DBR mirror 86 are non-conductive (k=0). The reflectance curve has a narrow bandwidth (0.00975 nm), and theoretically reaches 100% reflectivity at the resonant wavelength. FIG. 8 is a graph showing the reflectance versus wavelength of the resonant reflector of FIG. 6 when the top layers of the top DBR mirror 86 are slightly conductive (k=10$^{-5}$). As can be seen, the reflectance curve still has a narrow bandwidth (0.0097 nm), and theoretically reaches 100% reflectivity at the resonant wavelength. Therefore, and unlike FIG. 5, there is little or no degradation in the observed reflectance of the resonant reflector, even when placed adjacent a conductive layer.

Figure 9:
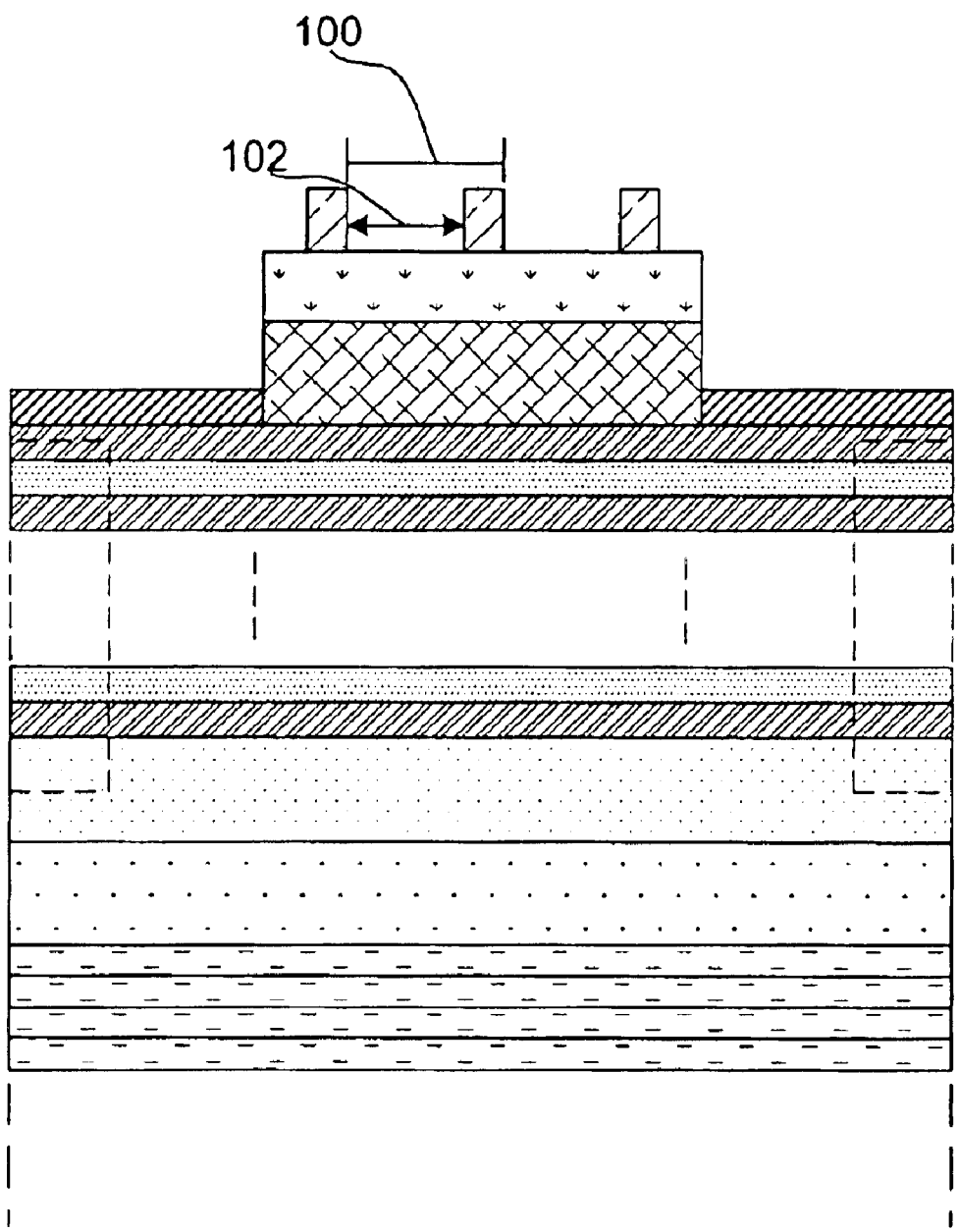
FIG. 9 is a schematic cross-sectional side view of a top surface emitting vertical cavity laser similar to that shown in FIG. 6, but with a modified grating fill factor.

FIG. 9 is a schematic cross-sectional side view of a top surface emitting vertical cavity laser similar to that shown in FIG. 6, but with a modified grating fill factor. The grating fill factor is defined as the grating spacing 102 divided by the grating period 100. The resonant wavelength of a resonant reflector is often determined by the grating period 100, and the spectral bandwidth is often determined by the modulation of the refractive index and fill factor of the grating.

When the grating is formed from an oxide such as SiO$_2$, the modulation of the refractive index is related to the difference between the dielectric constants of the grating material and the material that fills the spaces between the grating elements, divided by the average dielectric constant across the grating. The average dielectric constant across the grating can be changed by varying the fill factor of the grating. For example, and assuming a constant grating period, the grating fill factor can be increased by reducing the width of each grating element. A limitation of achieving a desired spectral bandwidth of a resonant reflector by altering the grating fill factor is that the design rules of many manufacturing processes limit the minimum width of the grating elements. Thus, to achieve some spectral bandwidths, the design rules may have to be pushed, which may reduce the manufacturing yield for the devices.

Figure 10:
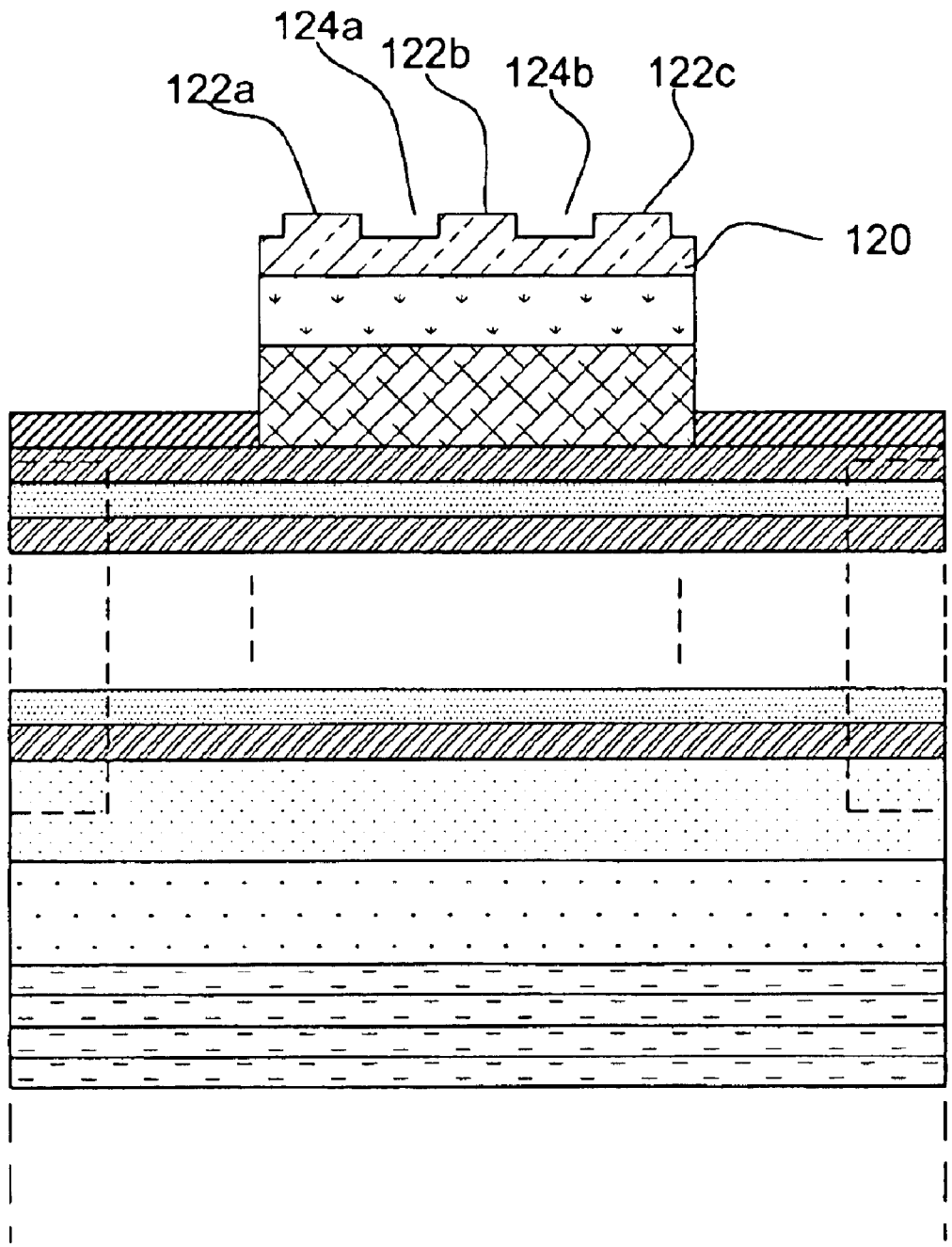
FIG. 10 is a schematic cross-sectional side view of a top surface emitting vertical cavity laser similar to that shown in FIG. 6, but with a grating film that has a controlled etch depth.

FIG. 10 is a schematic cross-sectional side view of a top surface emitting vertical cavity laser similar to that shown in FIG. 6, but with a grating film that has a controlled etch depth to control the spectral bandwidth of the resonant reflector. Like above, a grating film 120 is provided and subsequently etched to form two or more spaced grating regions 122a–122c separated by one or more spaced etched regions 124a–124b. However, rather than etching all the way through the grating film 120 to achieve a desired grating fill factor, and thus a desired spectral bandwidth, the depth of the etch is controlled. By controlling the depth of the etch, a desired average dielectric constant across the grating can be achieved. A benefit of this approach is that the grating width and grating spacing may be optimized to the design rules of the manufacturing process, and the etch depth can be controlled to achieve the desired spectral bandwidth. For example, a fill factor of about 50% is preferred. This may increase the producibility and yield of the resonant reflector.

Figure 11:
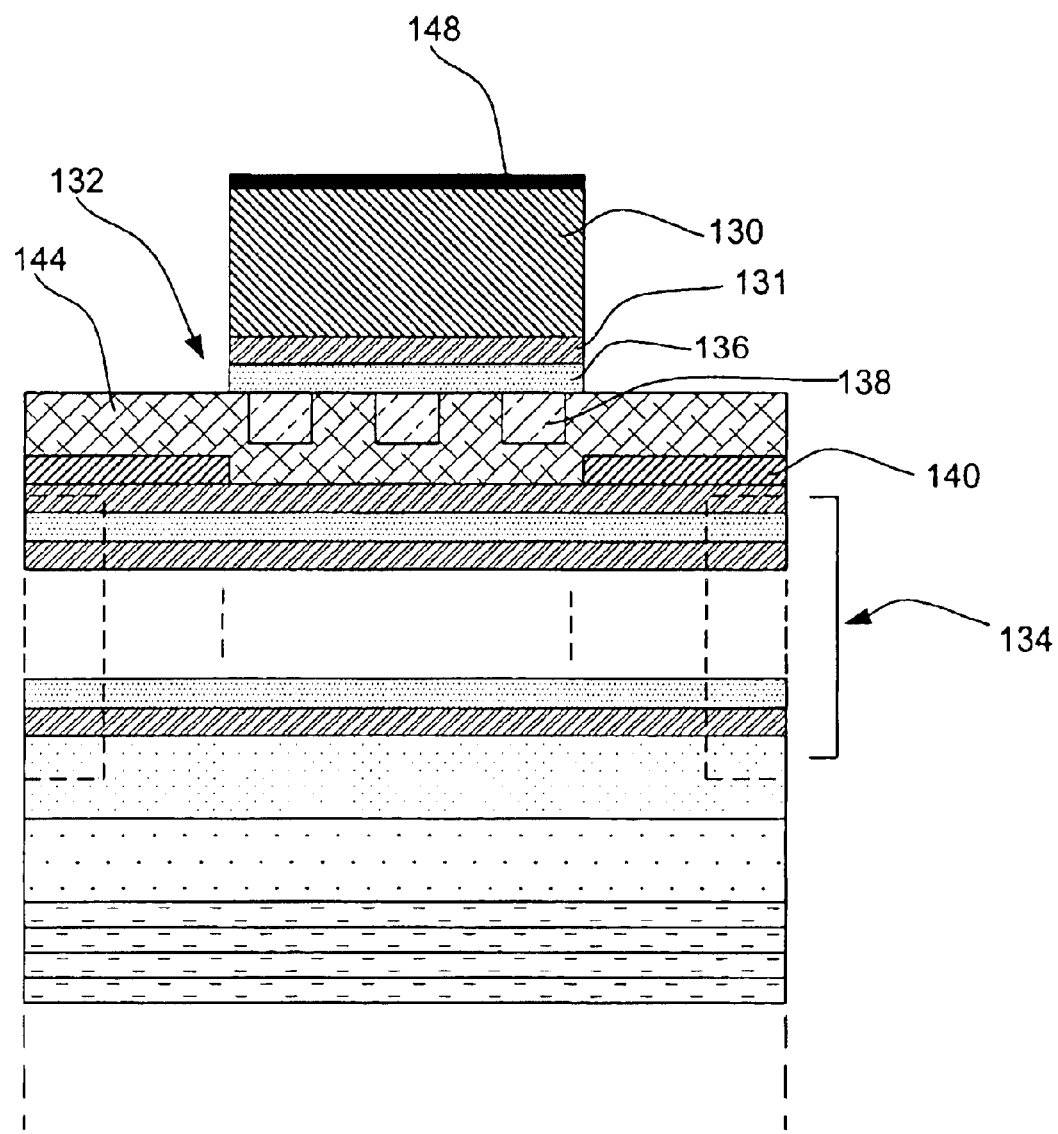
FIG. 11 is a schematic cross-sectional side view of a vertical cavity surface emitting laser that is formed by bonding a resonant reflector that was prepared on a first substrate to the top mirror of the vertical cavity surface emitting laser that was prepared on a second substrate.

FIG. 11 is a schematic cross-sectional side view of a vertical cavity surface emitting laser that is formed by bonding a resonant reflector 132 that is prepared on a first substrate 130 to a top mirror 134 of a vertical cavity surface emitting laser that is prepared on a second substrate. In accordance with this embodiment, a resonant reflector is formed on a front side 131 of a first substrate 130. This includes forming at least a waveguide 136 and a grating 138, as shown. Then, at least a portion of an optoelectronic device, such as a vertical cavity surface emitting laser or resonant cavity photodetector, is prepared on a front side of a second substrate. In FIG. 11, this includes a bottom DBR mirror, an active region, a top DBR mirror 134, and one or more contacts 140.

Thereafter, the front side of the first substrate 130 is bonded to the front side of the second substrate to complete the optoelectronic device. The first substrate 130 may be bonded to the second substrate using an optical epoxy 144, and preferably a non-conductive optical epoxy. The optical epoxy is preferably sufficiently thick, or has a sufficiently low refractive index relative to the refractive index of the waveguide 136 of the resonant reflector 132, so that the energy from the evanescent wave vector in the waveguide 136 is substantially prevented from entering the optoelectronic device on the first substrate. A anti-reflective coating 148 may be applied to the backside of the first substrate 130 as shown.

It is recognized that the relative position of the waveguide 136 and grating 138 may be changed. For example, and as shown in FIG. 11, the grating may be positioned more toward the front side of the first substrate than the waveguide. Alternatively, however, the waveguide may be positioned more toward the front side of the first substrate than the grating, if desired.

Figure 12:
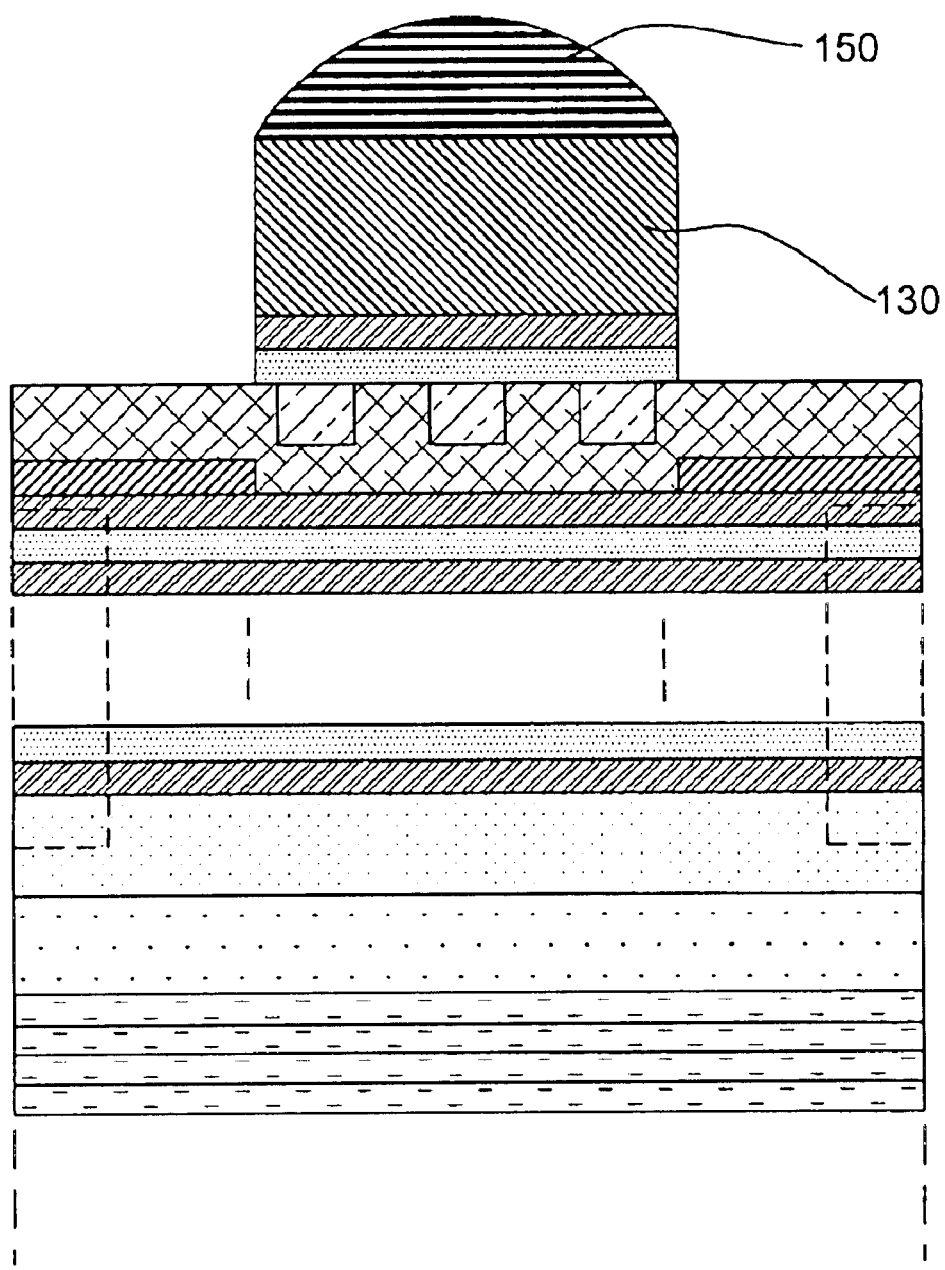
FIG. 12 is a schematic cross-sectional side view of the vertical cavity surface emitting laser of FIG. 11 with a microlens positioned on the backside of the substrate that has the resonant reflector formed thereon.

FIG. 12 is a schematic cross-sectional side view of the vertical cavity surface-emitting laser of FIG. 11 with a microlens 150 positioned on the backside of the first substrate 130. For top emitting devices, a microlens such as a collimating microlens may be formed on the backside of the first substrate 130. For back emitting devices, a collimating microlens may be formed on the backside of the substrate that carries the bottom mirror, the active region and the top mirror of the optoelectronic device. In either case, the collimating microlens 150 is preferably placed in registration with the output of the optoelectronic device as shown.

Figure 13:
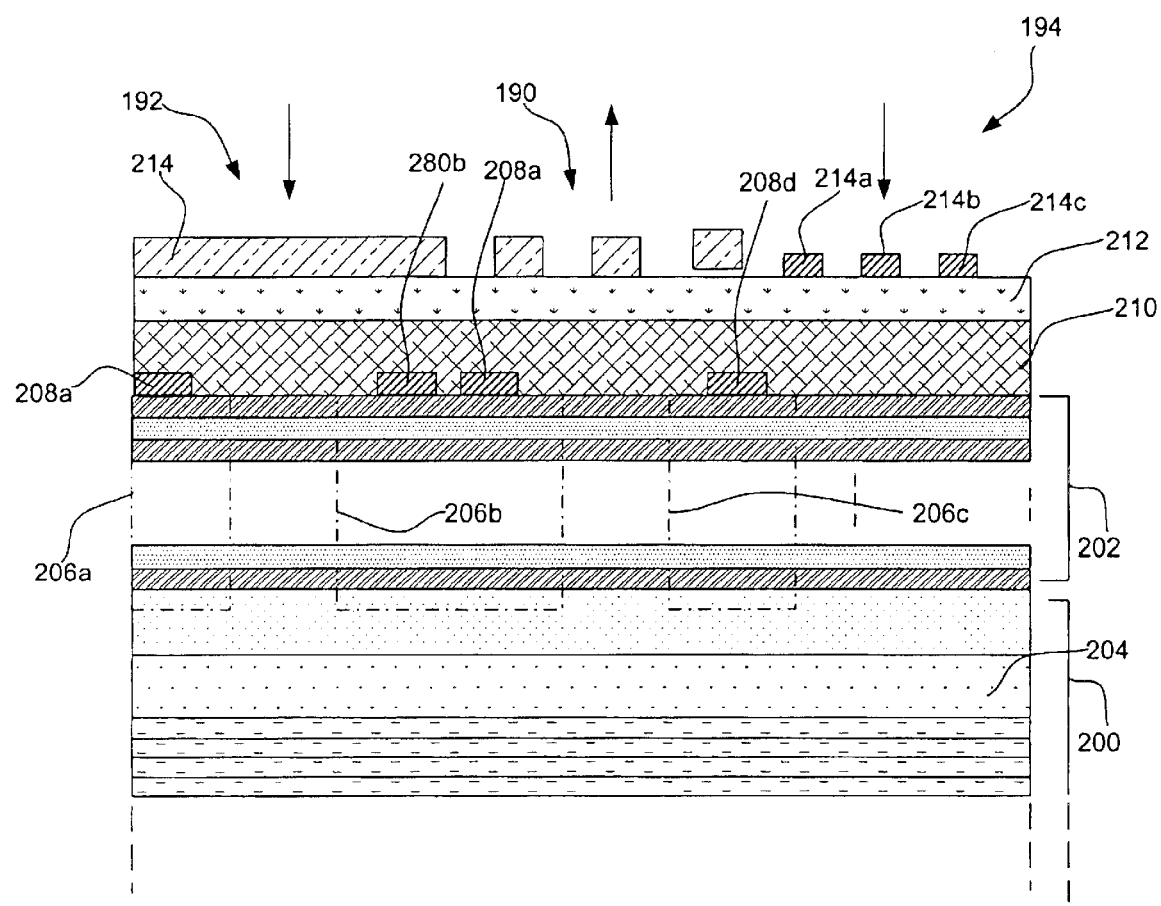
FIG. 13 is a schematic cross-sectional side view of an illustrative monolithic substrate having a RCPD, a VCSEL and a MSM.

It is contemplated that a number of optoelectronic devices may be formed on a common substrate, as shown in FIG. 13. One application for such a configuration is a monolithic transceiver that includes one or more light emitting devices 190 and one or more light receiving devices 192 and 194. In this illustrative embodiment, both the light emitting and light receiving devices are formed on a common substrate (not shown). In one example, a bottom mirror is first formed on the common substrate. The bottom mirror may serve as the bottom mirror for more than one of the optoelectronic devices 190, 192 and 194, and is preferably a DBR mirror stack that is doped to be at least partially conductive. An active region 200 is then formed on the bottom mirror, followed by a top mirror 202. Like the bottom mirror, the top mirror 202 is preferably a DBR mirror stack, and is doped to be the opposite conductivity type of the bottom mirror. The active region 200 may include cladding layers 204 on either side of the active region 200 to help focus the light energy and current in the active region.

A deep H+ ion implant, as shown at 206a–206c, may provide gain guide apertures for selected optoelectronic devices, and may further electrically isolate adjacent devices from one another. While a deep H+ implant is provided as an illustration, it is contemplated that any type of current and field confinement may be used, including for example, gain-guided, oxide-confinement, or any other means. Contacts 208a–208d may be provided on the top mirror 202 and on the bottom surface of the common substrate to provide electrical contact to each of the optoelectronic devices.

Next, a cladding or buffer layer 210 may be provided above the top mirror 202. A resonant reflector may then be provided on top of the cladding or buffer layer 210. The resonant reflector may include a waveguide 212 and a grating film 214. For some optoelectronic devices, such as top emitting devices 190, the grating film 214 may be etched to form a grating, as shown. The grating may substantially increase the reflectivity of the resonant reflector in those regions. For other optoelectronic devices, such as top receiving devices 192, the grating film may either include a different grating structure (e.g., wider spectral bandwidth), or remain non-etched as shown. This may reduce the reflectivity of the resonant reflector, thereby allowing light to more easily enter the optical cavity. For yet other optoelectronic devices, such as Metal-Semiconductor-Metal (MSM) receiving devices 194, the grating film may be removed altogether, and a metal grid 214a–214c may be formed on the waveguide layer 212 or cladding or buffer layer 210, as desired.

To isolate the resonant reflector from the optoelectronic devices, and in particular the conductive top mirror 202, the cladding or buffer layer 210 may be sufficiently thick to substantially prevent energy in the evanescent tail of the guided mode in the waveguide 212 from entering the top mirror 202. Alternatively, or in addition, the cladding or buffer layer 210 may be formed from a material that has a sufficiently low refractive index relative to the refractive index of the waveguide 212 to substantially prevent energy in the evanescent tail of the guided mode in the waveguide 212 from entering the top mirror 202.

Implementation of the described resonant reflector optoelectronic structures will permit polarization, emission wavelength and mode control. These structures and properties can be designed and fabricated using techniques such as lithography or holography, and may not be subject to growth thickness variations alone. The above techniques can be applied to produce, for example, VCSELs with high power single-mode/polarization emission from apertures exceeding a few microns in diameter. Furthermore, wavelength and/or polarization variation across a chip, array or wafer can be used for spatially varied wavelength/polarization division multiplexing, multi-wavelength spectroscopy, etc.

Figure 14:
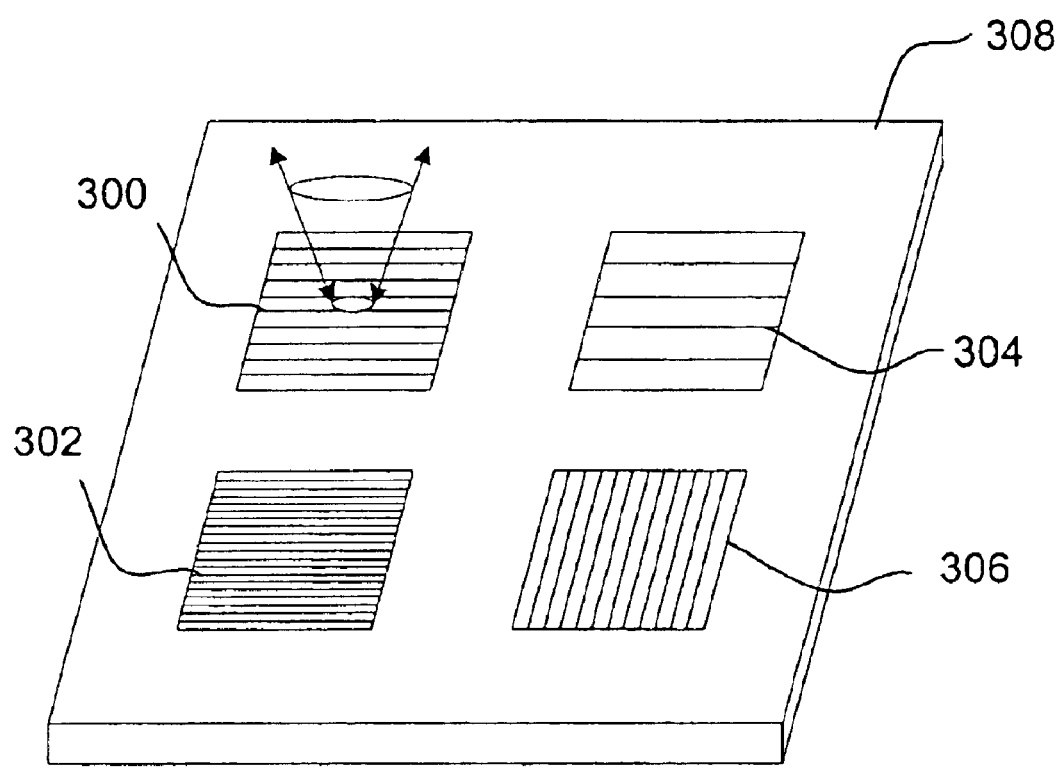
FIG. 14 is a schematic diagram of a number of illustrative optoelectronic emitters that have GMRGF filters for data/ telecommunication, processing, switching, etc., including embodiments conducive for wavelength division multiplexing, polarization division multiplexing, and space division multiplexing.

FIG. 14 is a schematic diagram of a number of illustrative optoelectronic emitters that have a guided-mode resonant reflector waveguide-grating (i.e. a guided-mode grating resonant reflector filter or GMGRF) for data/telecommunication, processing, switching, etc., including embodiments conducive for wavelength division multiplexing, polarization division multiplexing, space division multiplexing, etc. The illustrative optoelectronic emitters are shown at 300, 302, 304 and 306, respectively, and in the illustrative embodiment are monolithically formed on a common substrate 308. Each optoelectronic emitter includes a GMRGF filter integrated with or adjacent to the top mirror of the emitter. In one embodiment, the optoelectronic emitters are VCSEL devices.

The GMGRF of each emitter includes a waveguide and a grating. The various gratings are shown using parallel lines in FIG. 14, with each grating having different characteristics. For example, a first optoelectronic emitter 300 includes a grating that extends in a horizontal direction and has a first grating period. The grating direction helps determine the polarization direction of the light that is resonantly reflected by the GMGRF. The grating period may help determine the resonant wavelength of the GMGRF. Thus, the output emission may be inherently wavelength selective.

A second optoelectronic emitter is shown at 302. Optoelectronic emitter 302 includes a grating that also extends in a horizontal direction, but has a second grating period. Thus, the second optoelectronic emitter 302 may produce light that is polarized in the same direction as the first optoelectronic emitter 300. However, the narrower grating period may produce a shorter wavelength than the first optoelectronic emitter 300.

A third optoelectronic emitter is shown at 304. Optoelectronic emitter 304 includes a grating that also extends in a horizontal direction, but has a third grating period. Thus, the third optoelectronic emitter 304 produces light that is polarized in the same direction as the first and second optoelectronic emitters. However, the larger grating period may produce a longer wavelength than the first and second optoelectronic emitters.

Finally, a fourth optoelectronic emitter is shown at 306. Optoelectronic emitter 306 includes a grating that also extends in a perpendicular direction to that of the other optoelectronic emitters 300, 302 and 304. Thus, the fourth optoelectronic emitter 306 produces light that is polarized in a direction that is perpendicular to that of the other optoelectronic emitters 300, 302 and 304.

As can readily be seen, changing the period and/or direction of the grating may allow designers to control lithographically both the operating wavelength and polarization direction of the corresponding optoelectronic emitter devices. This may allow for SDM/WDM/PDM architectures having distributed wavelength and polarization modes. If the admission of light having any polarization is desired, the GMGRF may be fabricated with two crossed gratings aligned orthogonally with each other (e.g. bi-gratings).

As indicated above, the use of a GMGRF reflector can reduce the number of top DBR mirror periods when compared to an all-epitaxial DBR VCSEL or RCPD device. Reducing the number of DBR mirror periods can reduce the overall thickness of the device, which can lead to greater amenability to integration. Increased planarity and the utilization of standard semiconductor planar batch fabrication processes may also help improve producibility. The capability to readily control the wavelength, angular and bandwidth properties of the GMGRF reflector can provide greater flexibility in the construction of multi-element integrated circuits.

Figure 15:
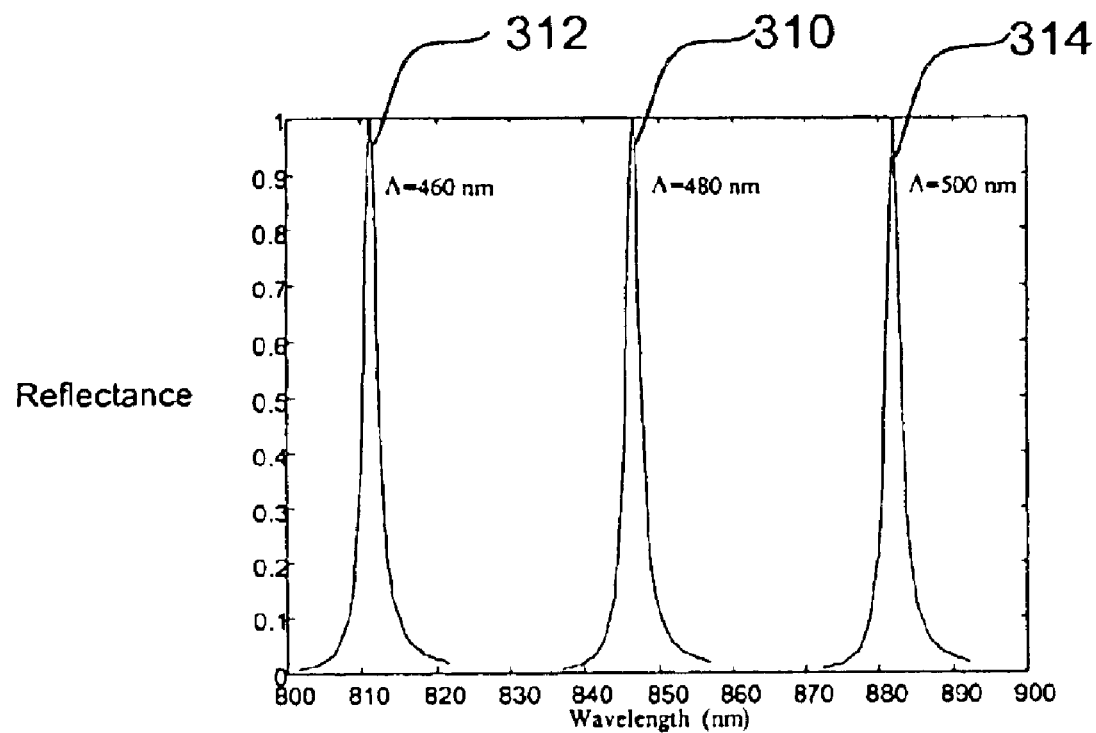
FIG. 15 is a graph showing reflectance versus wavelength for the three illustrative GMRGF filters of FIG. 14 that have a common polarization direction.

FIG. 15 is a graph showing reflectance versus wavelength for the three GMRGF filters 300, 302 and 304 of FIG. 14. Curves 310, 312 and 314 correspond to the GMGRF reflectance versus wavelength for optoelectronic devices 300, 302 and 304, respectively. In the illustrative embodiment, the grating period ($\Lambda$) of the first optoelectronic device 300 is 480 nm, which in the example shown, results in a peak reflectance at a wavelength of about 843 nm. The grating period ($\Lambda$) of the second optoelectronic device 302 is 460 nm, which in the example shown, results in a peak reflectance at a wavelength of about 811 nm. Finally, the grating period ($\Lambda$) of the third optoelectronic device 304 is 500 nm, which in the example shown, results in a peak reflectance at a wavelength of about 882 nm. The reflectance versus wavelength of the fourth optoelectronic device 306 is not shown in FIG. 15.

As described above, the number of DBR mirror periods of the top mirror of a VCSEL or RCPD device may be reduced, preferably so that resonance cannot readily be established without the additional reflectance provided by the GMGRF. In the illustrative embodiment, and referring to FIG. 15, the reflectance provided the GMGRF varies from near zero to near 100%, depending on the wavelength. Therefore, unique wavelength and/or polarization selectively may be provided for each optoelectronic device 300, 302, 304 and 306 by selecting appropriate parameters for the corresponding GMGRF. In this configuration, the resonant wavelength of the GMGRF may help determine, to a large extent, the cavity resonance wavelength and/or polarization of the corresponding optoelectronic device.

Figure 16:
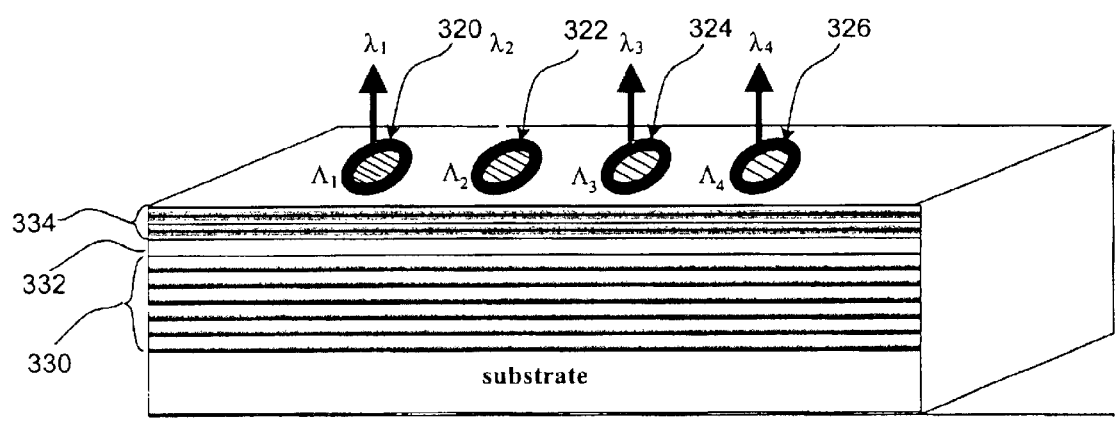
FIG. 16 is a schematic diagram showing an illustrative array of four VCSELs having a common epitaxial structure including a bottom mirror, an active region, a top mirror and a top GMGRF, where the grating period of each GMGRF is different for each VCSEL.

FIG. 16 is a schematic diagram showing an illustrative array of four VCSEL devices 320, 322, 324 and 326 fabricated as a common epitaxial structure. The common epitaxial structure includes a bottom mirror 330, an active region 332, and a top mirror 334. A top GMGRF is integrated with or provided adjacent to the top mirror 334, and in the embodiment shown, the grating period ($\Lambda$) of each GMGRF is different for each VCSEL device. As can be seen, the number of top DBR mirror periods is less than the number of bottom DBR mirror periods. As indicated above, the number of top DBR mirror periods is preferably reduced so that the lasing threshold cannot readily be established without the additional reflectance provided by the corresponding GMGRF.

The VCSEL devices 320, 322, 324 and 326 may be processed with topside electrical contacts with the GMGRF films positioned in the emitting aperture of each VCSEL. To tune the GMGRF, and in one example, a 1 nm increase in the grating period ($\Lambda$) may yield about a 1.8 nm increase in the resonant wavelength. Thus, if the desired resonant wavelengths were 842 nm, 847 nm, 852 nm, and 857 nm, respectively, then the grating periods for the four VCSEL devices 320, 322, 324 and 326 may be approximately 477.2 nm, 480 nm, 482.8 nm, and 485.8 nm.

Figure 17:
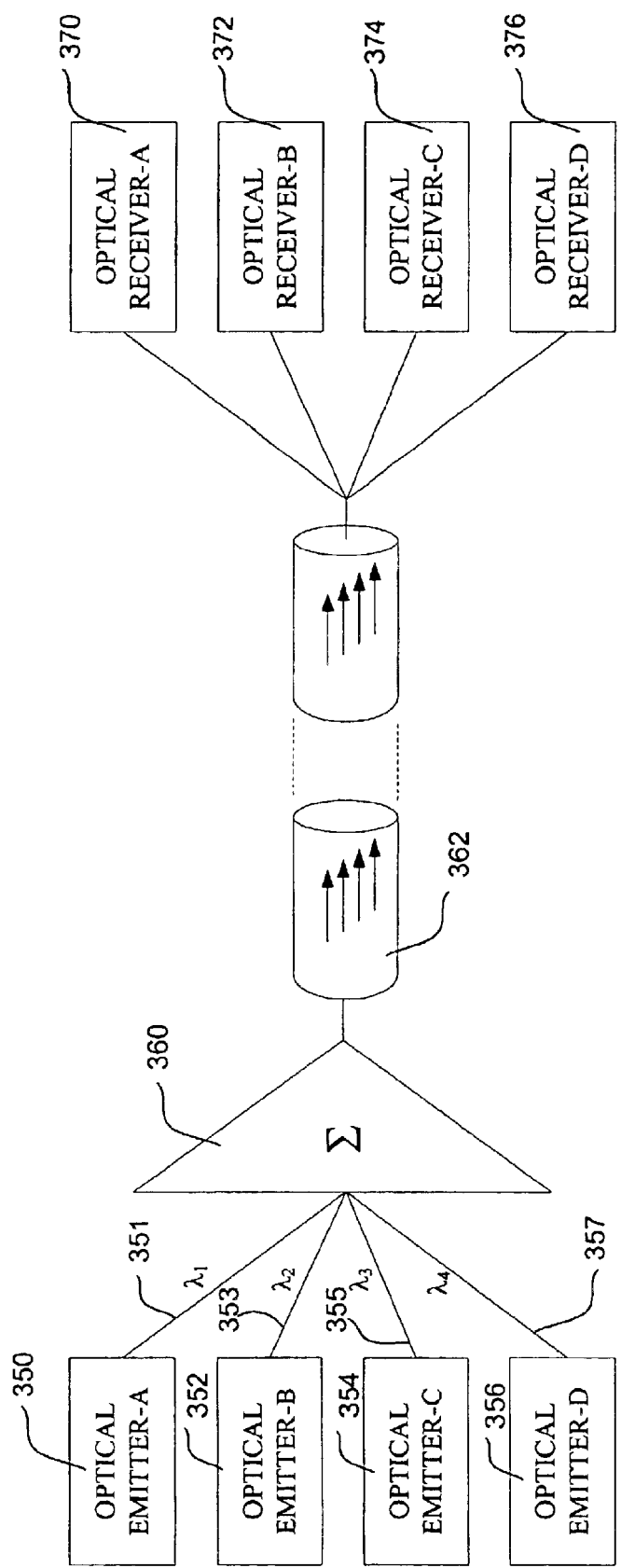
FIG. 17 is a schematic diagram showing an illustrative WDM/JWDD application using the array of four VCSELs of FIG. 16.

FIG. 17 is a schematic diagram showing an illustrative WDM/WDD/PDM application using the array of VCSEL devices of FIG. 16. Optical Emitter-A 350 corresponds to VCSEL 320, which produces a first wavelength $\lambda_1$ as shown at 351. Optical Emitter-B 352 corresponds to VCSEL 322, which produces a second wavelength $\lambda_2$ as shown at 353. Optical Emitter-C 354 corresponds to VCSEL 324, which produces a third wavelength $\lambda_3$ as shown at 355. Finally, Optical Emitter-D 356 corresponds to VCSEL 326, which produces a fourth wavelength $\lambda_4$ as shown at 357. The various wavelengths 351, 353, 355 and 357 are provided to a common optical receiver element by block 360. The common optical receiver element maybe, for example, a common optical fiber 362, as shown.

In order to increase the aggregate transmission bandwidth of an optical fiber, it is generally preferred that the wavelength spacing of simultaneously transmitted optical data streams, or optical data "channels," be closely packed, to accommodate a larger number of data channels. In other words, the difference in wavelength between two adjacent channels is preferably minimized. Because the wavelength of each VCSEL can be tightly controlled lithographically, a relatively large number of optical data channels can be accommodated. In some cases, the wavelength of adjacent optical channels may be 5 nm or less. Also, and as described above, the polarization direction of the VCSEL devices can be lithographically controlled, which may allow polarization Division Multiplexing (PDM) and/or WDM and PDM multiplexing. This can even further extend the bandwidth of some optical data channels.

In the illustrative embodiment, one or more optoelectronic receivers 370, 372, 374 and 376 are provided. In one embodiment, the light transmitted by the optical fiber 362 is provided to each of the optoelectronic receivers 370, 372, 374 and 376. Each of the optoelectronic receivers 370, 372, 374 and 376 maybe tuned to select the wavelength of one (or more) of the optical data channels. For example, and in one illustrative embodiment, each of the optoelectronic receives 370, 372, 374 and 376 is a RCPD device, with a GMGRF resonator that is tuned to a wavelength of a desired optical data channel. Each RCPD may be similar to the VCSEL devices 320, 322, 324 and 326 discussed above with respect to FIG. 16, but may be operated in a reverse bias mode. In some embodiments, the effective reflectivity of the top mirror (including the GMGRF) may be reduced and the lateral dimensions of the resonant cavity may be increased relative to a VCSEL device, which may increase the amount of light that is allowed to enter by the optical cavity.

Alternatively, or in addition, selected wavelengths may be directed to an optical receiver by an optical filter, optical splitter, or the like. In this embodiment, the optical receiver may be a wide band optical receiver, as the wavelength selectivity is provided by the optical filter, optical splitter, or the like, rather than the optical receiver itself.

Figure 18:
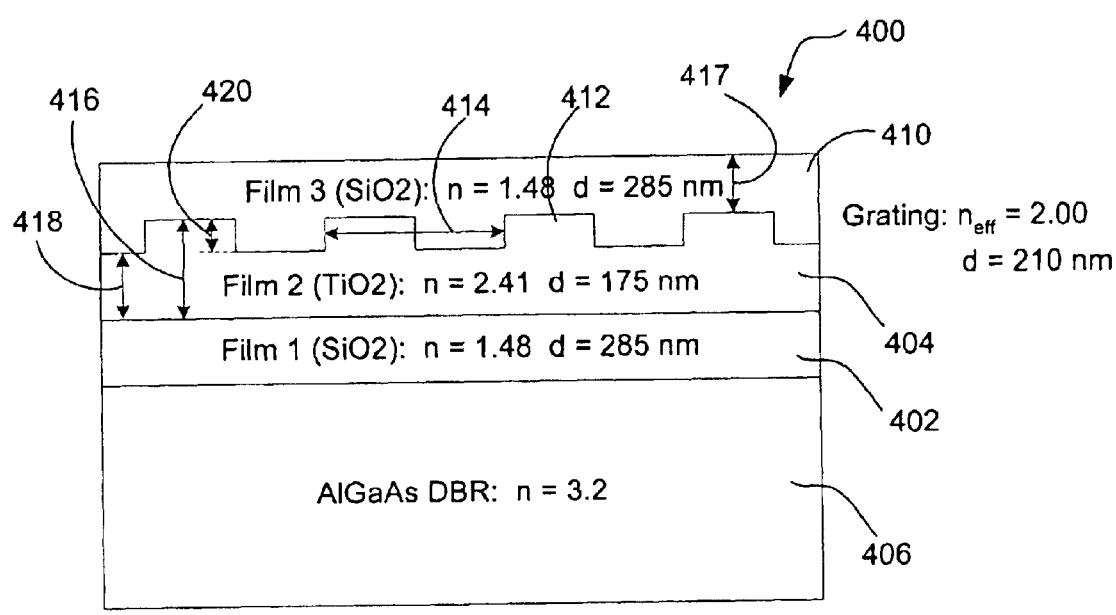
FIG. 18 is a schematic diagram showing an illustrative GMGRF filter in accordance with the present invention.

FIG. 18 is a schematic diagram showing an illustrative GMGRF filter 400 in accordance with the present invention. As described above, the GMGRF filter 400 may be incorporated into or positioned adjacent the top and/or bottom mirror of a VCSEL or RCPD device. The resonant wavelength of the GMGRF 400 may determine, at least to a large extent, the cavity resonance of the VCSEL or RCPD device.

In one illustrative embodiment, the GMGRF 400 includes a buffer layer 402 interposed between a core layer 404 and the top DBR mirror layer 406. The buffer layer 402 also serves as a clad layer. As indicated above, the buffer layer 402 is preferably sufficiently thick, and/or has a sufficiently low refractive index relative to the refractive index of the core layer 404 of the resonant reflector, to substantially prevent energy in the evanescent tail of the guided mode in the core layer 404 from entering an adjacent conductive layer of the optoelectronic device.

In the illustrative embodiment, an upper clad layer 410 is provided over a grating etched into the core layer 404. The grating elements 412 of the grating preferably have a grating period 414, and the core layer 404 preferably has a core depth 418 between adjacent grating elements 412. The overall core thickness at the grating elements 412 is shown at 416. In the illustrative embodiment, the core layer 404 is TiO2 with an index of refraction of about 2.41, and has a core depth of about 0.175 μm. Alternatively, it is contemplated that the core layer 404 may be, for example, GaAs or some other relatively high refractive index dielectric such as ZrO2, HfO2, or Si3N4. The thickness of the core layer 404 preferably is dependent on the refractive index difference between the core layer 404 and the buffer layer 402.

In the illustrative embodiment, the upper clad layer 410 is SiO$_2$ with an index of refraction of about 1.48, and having a clad depth 417 of about 0.285 μm. The upper clad layer 410 extends down between the grating elements 412 of the core layer 404, as shown. Thus, the upper clad layer 410 has an overall clad layer thickness between grating elements 412 that equals the clad depth 417 plus the grating height 420, or in this case about 0.495 μm. The buffer layer 402 in the illustrative embodiment is SiO2, with an index of refraction of 1.48 and a thickness of 0.285 μm. The top layer of the DBR mirror 406 may be, for example, AlGaAs with an index of refraction of 3.2. In this embodiment, and as described above, the buffer layer 402 preferably has an increased thickness and/or a reduced index of refraction, both of which help prevent energy in the evanescent tail of the guided mode in the core layer 404 from entering the top DBR mirror 406.

The resonant wavelength of the GMGRF 400 can be set in a reliable manner by appropriately selecting GMGRF parameters, such as the grating period (Λ) 414, core depth 418 versus grating height 420, grating direction, etc. More specifically, and in one illustrative embodiment, in an array of VCSEL devices having a common epitaxial structure (bottom mirror, active region, top mirror including a GMGRF), the lasing wavelength of each VCSEL in the array can be prescribed individually by changing the GMGRF parameters that affect the resonant wavelength. Most conveniently, this can be done by changing the grating period (Λ) 414 while keeping all other parameters fixed, or by increasing the grating height 420 while maintaining a substantially constant core thickness 416 (and hence reducing the core depth 418 of the core layer 404 by a corresponding amount), while keeping the grating period (Λ) 414 fixed. However, it is contemplated that these and/or other GMGRF parameters may be changed in any suitable manner to achieve the desired resonant wavelength for each VCSEL in the array.

Figure 19:
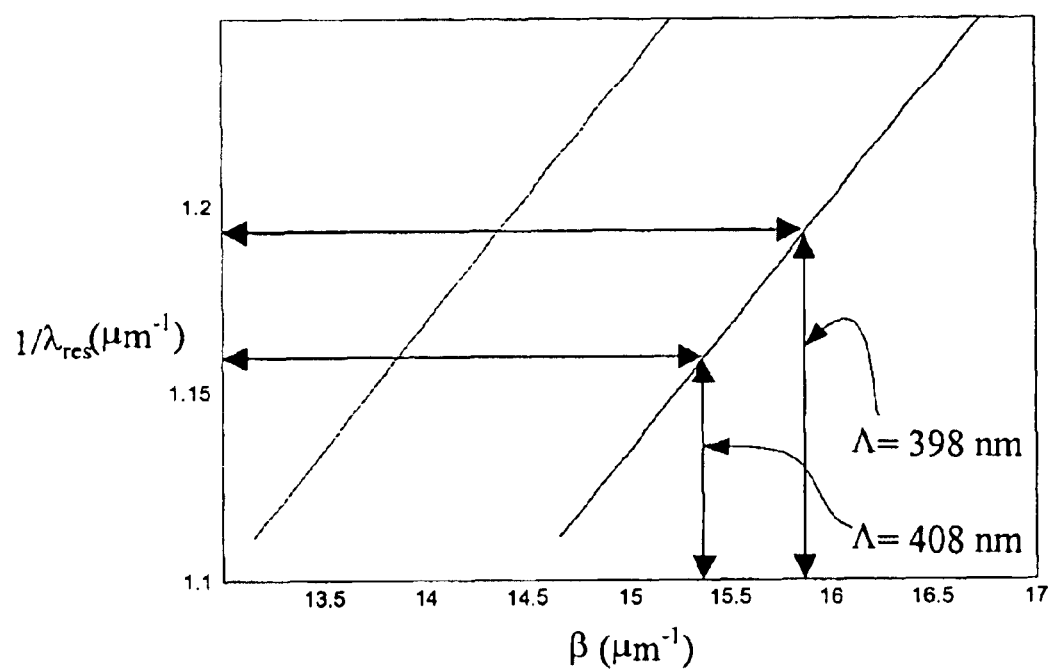
FIG. 19 is a graph showing the relationship between grating period ($\Lambda$) and the resonant wavelength for the GMGRF shown in FIG. 18.

FIG. 19 is a graph showing the relationship between the grating period (Λ) 414 and the resonant wavelength for the GMGRF shown in FIG. 18. In this example, the DBR epilayers in the top mirror of a VCSEL are represented as a single layer having an average refractive index of 3.2. The upper clad layer 410 and buffer layer 402 have optical thicknesses of a half-wave at approximately 850 nm (about 0.285 μm). The grating elements 412 provide modulation in the dielectric constant of the core layer 404, and enforces coupling of a normally-incident planewave via the first diffractive order of the grating into a guided-mode supported by the core layer 404.

The resonant wavelength of this GMGRF structure can be determined approximately by using the mode-matching condition:

$$\beta = 2\pi/\Lambda \qquad \text{Equation (1)}$$

where Λ is the grating period 414 and β is the eigenvalue (propagation wavenumber) of the guided mode excited.

The structure may be modeled as a homogenized multi-layer planar waveguide by replacing the grating layer with a homongeneous film having an effective refractive index ($n_{eff}$) determined by the Rytov effective medium expression, which in a first-order approximation reads:

$$<n>^2 = FF * n_{hi}^2 + (1-FF) * n_{lo}^2 \text{ for } TE \text{ polarization} \qquad \text{Equation (2)}$$

OR $$<n>^{-2} = FF * n_{hi}^{-2} + (1-FF) * n_{lo}^{-2} \text{ for } TM \text{ polarization} \qquad \text{Equation (3)}$$

where FF equals the grating fill factor defined with respect to the high index material.

A desired resonant wavelength $\lambda_1$ and polarization (TE or TM) are then selected. The film thicknesses are preferably chosen on the basis of out-of-band optical reflectance, throughput, and core isolation from the substrate. The grating may be modeled as its homogenized equivalent thin film, and the structure may be analyzed as a multi-layer planar waveguide. This analysis may yield the guided mode eigenvalues β for the waveguide, and one (usually the fundamental mode with largest β) is chosen. The grating period which excites this mode is then given approximately by equation (1) above. Illustrated results for the GMGRF 400 of FIG. 18 are shown graphically in FIG. 19.

Figure 20:
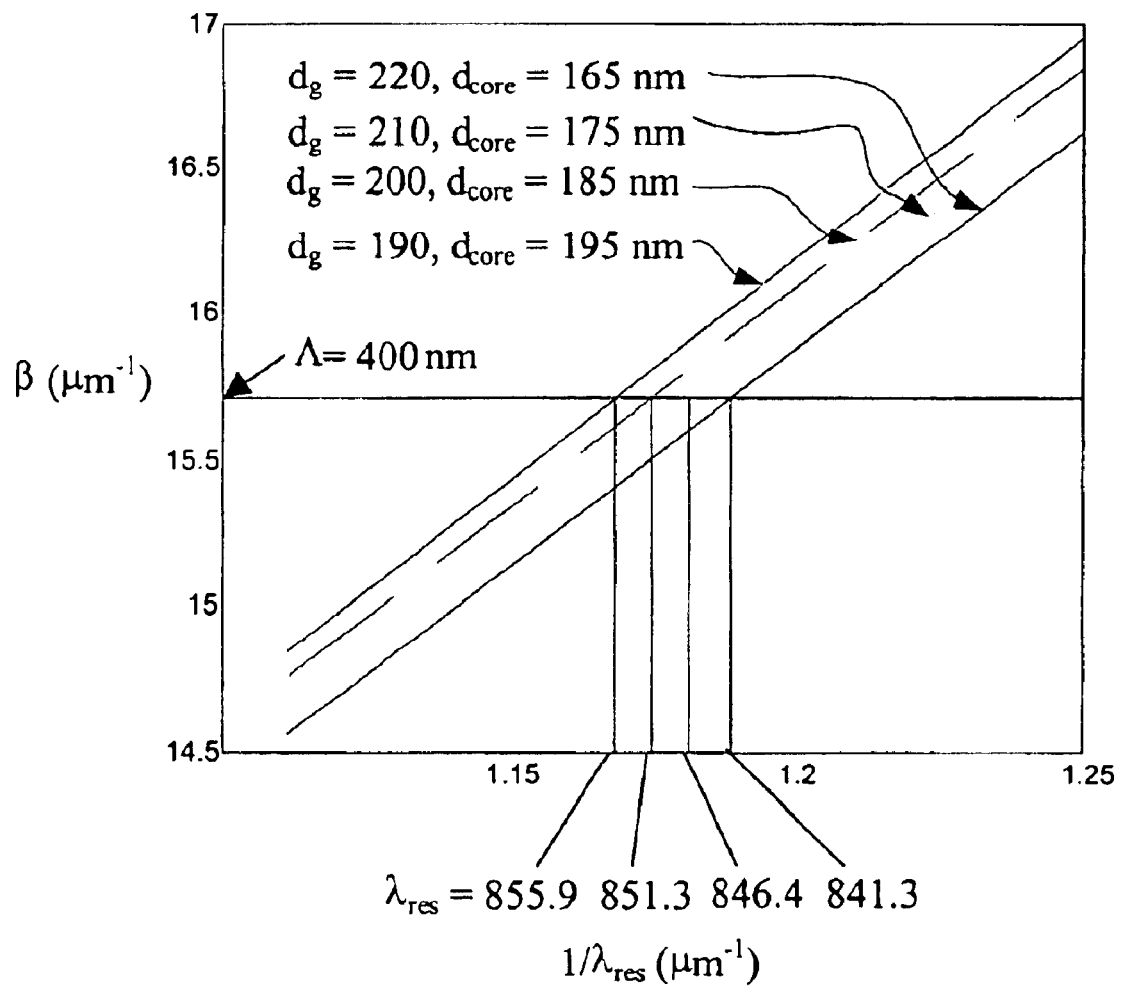
FIG. 20 is a graph showing the relationship between the grating height 420/ core depth 418 and the resonant wavelength for the GMGRF shown in FIG. 18.

FIG. 20 is a graph showing the relationship between the grating height 420/ core depth 418 and the resonant wavelength for the GMGRF shown in FIG. 18. As indicated above, the resonant wavelength of the GMGRF 400 may be controlled by increasing the grating height 420 while maintaining a substantially constant core thickness 416 (and hence reducing the core depth 418 of the core layer 404 by a corresponding amount), while keeping the grating period (Λ) 414 fixed. Illustrated results for the GMGRF 400 of FIG. 18 are shown graphically in FIG. 20 for four combinations of grating height 420 and core depth 418, while leaving the overall core thickness 416 and grating period 414 constant.

Regardless of the method used to choose GMGRF parameters to achieve a desired resonant wavelength, the structure can be analyzed with a grating solver to estimate more precisely the GMGRF resonant wavelength and the Fabry-Perot resonance of the combined top-mirror assembly with the rest of the VCSEL or RCPD structure. If desired, minor adjustments in the GMGRF parameters can then be made to yield a desired resonant wavelength.

It is recognized that the wavelength selectivity capability of such GMGRF filters has applicability in display applications. As the grating itself may determine the wavelength of operation, and fabrication is done lithographically, laterally-displaced wavelength dependent emitters can be formed. Such a structure may also serve as a quasi-tunable laser source. Wavelength tunable VCSELs and detectors, as described above, may also find use in spectroscopic and sensing applications.

The improved performance coupled with the capability to control polarization can also lend itself to applications in polarization-sensitive optical read/write applications. Included are various forms of CD, DVD, and holographic storage applications. Laser printing heads may also benefit. The performance advantage, and use of thinner top and/or bottom mirrors becomes even more paramount when extending VCSELs into the visible wavelengths, where typical all-epitaxial DBRs become prohibitively thick and may require twice as many layers.

Having thus described the preferred embodiments of the present invention, those of skill in the art will readily appreciate that the teachings found herein may be applied to yet other embodiments within the scope of the claims hereto attached.

What is claimed is:

1. An optical system, comprising:
   at least two optoelectronic emitters, each having a guided-mode grating resonant reflector filter (GMGRF), wherein the GMGRF for each optoelectronic emitter is adapted to select a light output that has a different wavelength and/or polarization, and wherein the light output produced by the at least two optoelectronic emitters are provided to a common optical receiver element.

2. An optical system according to claim 1 wherein:
   a first optoelectronic emitter of the at least two optical emitters has a top mirror, a bottom mirror, and a GMGRF positioned adjacent a selected one of the top or bottom mirrors, the GMGRF having a waveguide and a grating, the waveguide and the grating being configured to produce a first light output that has a first wavelength; and
   a second optoelectronic emitter of the at least two optoelectronic emitters has a top mirror, a bottom mirror, and a GMGRF positioned adjacent a selected one of the top or bottom mirrors, the GMGRF having a waveguide and a grating, the waveguide and the grating of the second optoelectronic emitter being configured to produce a second light output with a second wavelength, wherein the first wavelength is different from the second wavelength.

3. An optical system according to claim 2 further comprising:
   providing means for providing the first and second light outputs to the common optical receiver element.

4. An optical system according to claim 3 wherein the common optical receiver element is an optical fiber.

5. An optical system according to claim 2, wherein the waveguide and the grating of the GMGRF of the first optoelectronic emitter are configured such that a first-diffraction order wave vector of the grating substantially matches a propagating mode of the waveguide.

6. An optical system according to claim 5, wherein the waveguide and the grating of the GMGRF of the second optoelectronic emitter are configured such that a first-diffraction order wave vector of the grating substantially matches a propagating mode of the waveguide.

7. An optical system according to claim 5, wherein the first optoelectronic emitter further comprises:
   a cladding or buffer layer positioned between the GMGRF and the selected top or bottom mirror, the cladding or buffer layer being sufficiently thick, or having a sufficiently low refractive index relative to the refractive index of the waveguide, to substantially prevent energy in the evanescent tail of the propagation mode of the waveguide from entering the selected top or bottom mirror.

8. An optical system according to claim 7, wherein the second optoelectronic emitter further comprises:
   a cladding or buffer layer positioned between the GMGRF and the selected top or bottom mirror, the cladding or buffer layer being sufficiently thick, or having a sufficiently low refractive index relative to the refractive index of the waveguide, to substantially prevent energy in the evanescent tail of the propagation mode of the waveguide from entering the selected top or bottom mirror.

9. An optical system according to claim 2 wherein a core layer is positioned adjacent the grating of the first optoelectronic emitter, the core layer having a core thickness, and the grating having a grating period and a grating height.

10. An optical system according to claim 9 wherein the core thickness and grating height of the first optoelectronic emitter remain fixed, and the grating period is photolithographically set to produce the first wavelength.

11. An optical system according to claim 10 wherein a core layer is positioned adjacent the grating of the second optoelectronic emitter, the core layer having a core thickness, and the grating having a grating period and a grating height.

12. An optical system according to claim 11 wherein the core thickness and grating height of the second optoelectronic emitter remain fixed, and the grating period is photolithographically set to produce the second wavelength.

13. An optical system according to claim 12 wherein the grating height and core thickness of the first optoelectronic emitter are substantially the same as the grating height and core thickness of the second optoelectronic emitter.

14. An optical system according to claim 9 wherein the grating extends into the core layer of the first optoelectronic emitter, leaving a core depth between the grating and an opposite surface of the core layer, the ratio of the core depth to the grating height being set to produce the first wavelength.

15. An optical system according to claim 14 wherein a core layer is positioned adjacent the grating of the second optoelectronic emitter, the core layer having a core thickness, and the grating having a grating period and a grating thickness, the grating extends into the core layer of the second optoelectronic emitter, leaving a core depth between the grating and an opposite surface of the core layer, the ratio of the core depth to the grating height being set to produce the second wavelength.

16. An optical system according to claim 15 wherein the core thickness of the first optoelectronic emitter and the core thickness of the second optoelectronic emitter are substantially the same.

17. An optical system according to claim 2 wherein the at least two optoelectronic emitters are fabricated on a common substrate.

18. An optical system according to claim 1 wherein the light outputs produced by the at least two optoelectronic emitters are eventually provided to at least two optical receivers, wherein each optical receiver is adapted to selectively receive one of the wavelengths and/or polarizations provided by the at least two optoelectronic emitters.

19. An optical system according to claim 18 the at least two optical receivers include:
a first optoelectronic receiver that includes a top mirror, a bottom mirror, and a resonant reflector positioned adjacent a selected one of the top or bottom mirrors, the GMGRF having a waveguide and a grating, the waveguide and grating being configured to receive a first wavelength; and
a second optoelectronic receiver that includes a top mirror, a bottom mirror, and a GMGRF positioned adjacent a selected one of the top or bottom mirrors, the GMGRF having a waveguide and a grating, the waveguide and grating of the second optoelectronic receiver being configured to produce a second light output with a second wavelength, wherein the first wavelength is different from the second wavelength.

20. An optical system according to claim 19 wherein the first optoelectronic receiver and the second optoelectronic receiver are fabricated on a common substrate.

21. An optical system, comprising:
a first optoelectronic emitter having a top mirror, a bottom mirror, and a GMGRF positioned adjacent a selected one of the top or bottom mirrors, the GMGRF having a waveguide and a grating, the waveguide and grating being configured to produce a first light output that has a first polarization;
a second optoelectronic emitter having a top mirror, a bottom mirror, and a GMGRF positioned adjacent a selected one of the top or bottom mirrors, the GMGRF having a waveguide and a grating, the waveguide and grating of the second optoelectronic emitter being configured to produce a second light output with a second polarization, wherein the first polarization is different from the second polarization; and
providing means for providing the first and second light outputs to the common optical receiver element.

22. An optical system according to claim 18 further comprising:
a first optoelectronic receiver that is adapted to selectively receive light having the first polarization from the common receiver element; and
a second optoelectronic receiver that is adapted to selectively receive light having the second polarization from the common receiver element.

23. An optical system according to claim 22 wherein:
the first optoelectronic receiver includes a top mirror, a bottom mirror, and a GMGRF positioned adjacent a selected one of the top or bottom mirrors, the GMGRF having a waveguide and a grating, the waveguide and grating being configured to receive the first light output having the first polarization; and
the second optoelectronic receiver includes a top mirror, a bottom mirror, and a GMGRF positioned adjacent a selected one of the top or bottom mirrors, the GMGRF having a waveguide and a grating, the waveguide and grating being configured to receive the second light output having the second polarization, wherein the first polarization is different from the second polarization.

24. An optical system according to claim 20 wherein the first optoelectronic receiver and the second optoelectronic receiver are produced on a common substrate.

* * * * *